United States Patent
Yamashita

(10) Patent No.: US 9,293,682 B2
(45) Date of Patent: Mar. 22, 2016

(54) LIQUID JETTING APPARATUS

(71) Applicant: Brother Kogyo Kabushiki Kaisha, Nagoya-shi, Aichi-ken (JP)

(72) Inventor: Toru Yamashita, Nagoya (JP)

(73) Assignee: BROTHER KOGYO KABUSHIKI KAISHA, Nagoya-Shi, Aichi-Ken (JP)

( * ) Notice: Subject to any disclaimer, the term of this patent is extended or adjusted under 35 U.S.C. 154(b) by 0 days.

(21) Appl. No.: 14/658,508

(22) Filed: Mar. 16, 2015

(65) Prior Publication Data
US 2015/0273829 A1  Oct. 1, 2015

(30) Foreign Application Priority Data
Mar. 26, 2014 (JP) ................................. 2014-063830

(51) Int. Cl.
 *B41J 2/14* (2006.01)
 *H01L 41/04* (2006.01)
 *H01L 41/09* (2006.01)

(52) U.S. Cl.
 CPC ........... *H01L 41/042* (2013.01); *B41J 2/14233* (2013.01); *H01L 41/09* (2013.01); *B41J 2002/14241* (2013.01); *B41J 2002/14491* (2013.01)

(58) Field of Classification Search
 CPC ............... B41J 2002/14491; B41J 2002/1425; B41J 2002/14258
 See application file for complete search history.

(56) References Cited

U.S. PATENT DOCUMENTS

| 4,384,229 A * | 5/1983 | Inoue ...................... H03H 3/04 310/315 |
| 6,471,342 B1 | 10/2002 | Horio et al. |
| 7,843,113 B2 * | 11/2010 | Wijngaards .......... B41J 2/14233 310/320 |
| 8,708,460 B2 * | 4/2014 | Yamashita ............. B41J 2/0455 347/50 |
| 2004/0252151 A1* | 12/2004 | Higuchi ................. B41J 2/0451 347/19 |
| 2006/0038858 A1* | 2/2006 | Ishizaki ......................... 347/68 |

(Continued)

FOREIGN PATENT DOCUMENTS

| JP | 2000/079683 | 3/2000 |
| JP | 2012/069548 | 4/2012 |
| JP | 2013/208900 | 10/2013 |

*Primary Examiner* — Stephen Meier
*Assistant Examiner* — John P Zimmermann
(74) *Attorney, Agent, or Firm* — Frommer Lawrence & Haug LLP

(57) ABSTRACT

There is provided a liquid jetting apparatus including: a first channel structure; a piezoelectric actuator provided on the first channel structure; and a driving device. The piezoelectric actuator includes: a vibration plate; a plurality of piezoelectric elements each including an activator formed of a piezoelectric material; signal input portions which receive drive signals for driving the plurality of piezoelectric elements from the driving device; a reference potential portion; and actuator wires. The piezoelectric elements include a first and second piezoelectric elements, a length of a wire which connects the first piezoelectric element and the driving device is longer than a length of a wire which connects the second piezoelectric element and the driving device, a capacitor is serially connected to the first piezoelectric element, and the capacitor includes an insulator formed of a piezoelectric material same as the piezoelectric material of the activators of the piezoelectric elements.

12 Claims, 13 Drawing Sheets

(56) References Cited

U.S. PATENT DOCUMENTS

| | | | |
|---|---|---|---|
| 2007/0279446 A1* | 12/2007 | Ishizaki | 347/19 |
| 2008/0088672 A1* | 4/2008 | Kobayashi | B41J 2/0451 347/50 |
| 2011/0090273 A1* | 4/2011 | Miyazaki | B41J 2/04553 347/10 |
| 2012/0067624 A1 | 3/2012 | Kubo et al. | |
| 2013/0222481 A1 | 8/2013 | Yokoyama et al. | |
| 2013/0222484 A1 | 8/2013 | Yokoyama et al. | |

\* cited by examiner

LIQUID JETTING APPARATUS

CROSS REFERENCE TO RELATED APPLICATION

The present application claims priority from Japanese Patent Application No. 2014-063830, filed on Mar. 26, 2014, the disclosure of which is incorporated herein by reference in its entirety.

BACKGROUND OF THE INVENTION

1. Field of the Invention

The present teaching relates to a liquid jetting apparatus configured to jet a liquid.

2. Description of the Related Art

As a liquid jetting apparatus, an ink-jet head which jets ink has been known. The ink-jet head includes: a channel unit in which a plurality of nozzles and a plurality of pressure chambers communicating with the plurality of nozzles respectively are formed; and a piezoelectric actuator provided on the channel unit so as to cover the plurality of pressure chambers. The piezoelectric actuator has a piezoelectric layer, a plurality of individual electrodes formed on a surface of the piezoelectric layer so as to correspond to the plurality of nozzles respectively, and a common electrode facing the plurality of individual electrodes in common. In this ink-jet head, an upper surface of a vibration plate plays a role of the common electrode.

A wiring board (COF) is connected to the surface of the piezoelectric actuator. On the wiring board, a driver IC and a plurality of wires connected to the driver IC are provided. Each of the individual electrodes of the piezoelectric actuator is connected to the driver IC via the wire of the wiring board. When a drive signal is output to a certain one of the individual electrodes from the driver IC, an electric field acts on a portion of the piezoelectric layer sandwiched by this individual electrode and the common electrode (vibration plate), so that the piezoelectric layer deforms. Due to the deformation of the piezoelectric layer, a pressure is applied to the ink in the pressure chamber, so that the ink is jetted from the nozzle. In the below, for convenience of explanation, one element composed of the single individual electrode, the common electrode, and the portion of the piezoelectric layer sandwiched by the single individual electrode and the common electrode will be referred to as one piezoelectric element.

In the above-described ink-jet head, each of the individual electrodes of the piezoelectric actuator is connected to the single driver IC via each of the wires of the wiring member. Here, distances from the single driver IC to the individual electrodes of the plurality of piezoelectric elements are not equal, and a length of the wire connecting one of the individual electrodes and the driver IC is different among the plurality of piezoelectric elements. As for a piezoelectric element which is distant from the driver IC, that is, the piezoelectric element which is connected to the driver IC with a long wire, an electrical resistance of the long wire is large and accordingly, responsiveness to the drive signal output from the driver IC is deteriorated. Accordingly, behavior of the piezoelectric element varies among the plurality of piezoelectric elements, and thus, jetting characteristics, such as a jetting velocity and a jetting amount, of the liquid jetted from the nozzles also vary.

SUMMARY

An object of the present teaching is suppressing variation in responsiveness to a drive signal, among a plurality of piezoelectric elements, the variation being caused due to a difference in an electrical resistance of a wire connected to each of the piezoelectric elements.

A liquid jetting apparatus of this teaching includes: a first channel structure in which a first liquid channel is formed, the first liquid channel including a plurality of nozzles and a plurality of pressure chambers communicating with the plurality of nozzles respectively; a piezoelectric actuator provided on the first channel structure to cover the plurality of pressure chambers; and a driving device configured to drive the piezoelectric actuator, wherein: the piezoelectric actuator includes: a vibration plate configured to cover the plurality of pressure chambers; a plurality of piezoelectric elements which are disposed on the vibration plate to correspond to the plurality of pressure chambers respectively, each of the plurality of piezoelectric elements including an activator formed of a piezoelectric material; a plurality of signal input portions which is provided on the vibration plate and which is connected to the driving device to receive drive signals for driving the plurality of piezoelectric elements from the driving device; a reference potential portion to which a reference potential is applied; and a plurality of actuator wires each of which connects one of the plurality of piezoelectric elements and one of the plurality of signal input portions and the reference potential portion; the plurality of piezoelectric elements include a first piezoelectric element and a second piezoelectric element; a total length of a wire which connects the first piezoelectric element and the driving device and which includes the actuator wire is longer than a total length of a wire which connects the second piezoelectric element and the driving device and which includes the actuator wire, the piezoelectric actuator further including a capacitor that is connected to the actuator wire which connects the first piezoelectric element and the signal input portion or the actuator wire which connects the first piezoelectric element and the reference potential portion such that the capacitor is serially connected to the first piezoelectric element; and the capacitor includes an insulator formed of a piezoelectric material same as the piezoelectric material of the activators of the plurality of piezoelectric elements.

In this teaching, each piezoelectric element of the piezoelectric actuator is connected by an actuator wire to the signal input portion to which the drive signal is input from the driving device and to the reference potential portion to which the reference potential is applied. In a case that the drive signal is supplied to the piezoelectric element from the driving device via the signal input portion, a voltage applied to the activator of the piezoelectric element varies, and an electric field is generated inside the activator. Due to this electric field, deformation occurs in the piezoelectric element to cause displacement of the vibration plate, and thus, jetting energy is applied to the liquid in the pressure chamber.

Further, the piezoelectric elements include the first piezoelectric element and the second piezoelectric element, a total length of a wire connecting the first piezoelectric element to the driving device and a total length of a wire connecting the second piezoelectric element to the driving device being different from each other. As for the first piezoelectric element connected to the driving device with a wire of which total length is long, a capacitor is connected to an actuator wire connecting the first piezoelectric element and the signal input portion or an actuator wire connecting the first piezoelectric element and the reference potential portion such that the capacitor is serially connected to the first piezoelectric element. This means that a capacitor is added to a circuit from the driving devise to the reference potential portion via the first piezoelectric element such that the capacitor is serially connected to the first piezoelectric element, and thus, the resultant capacitance of the circuit is reduced. That is, a time constant of the circuit becomes small, and thus, a change of a voltage applied to the first piezoelectric element that occurs in a case that a driving signal is supplied to the first piezoelectric element becomes quick. With this, as for the first piezoelectric element, deterioration of responsiveness to the driving signal caused due to long wire is reduced. Accordingly, a variation of the responsiveness to the driving signal between the first piezoelectric element and the second piezoelectric element becomes small, the variation being caused due to difference between an electrical resistance of the wire connected to the first piezoelectric element and an electrical resistance of the wire connected to the second piezoelectric element. Further, the capacitor has the insulator formed of the same piezoelectric material as that of the activators of the piezoelectric elements. Therefore, it is possible to form the activator of the piezoelectric element and the insulator of the capacitor by a single process.

DESCRIPTION OF THE EMBODIMENTS

Figure 1:
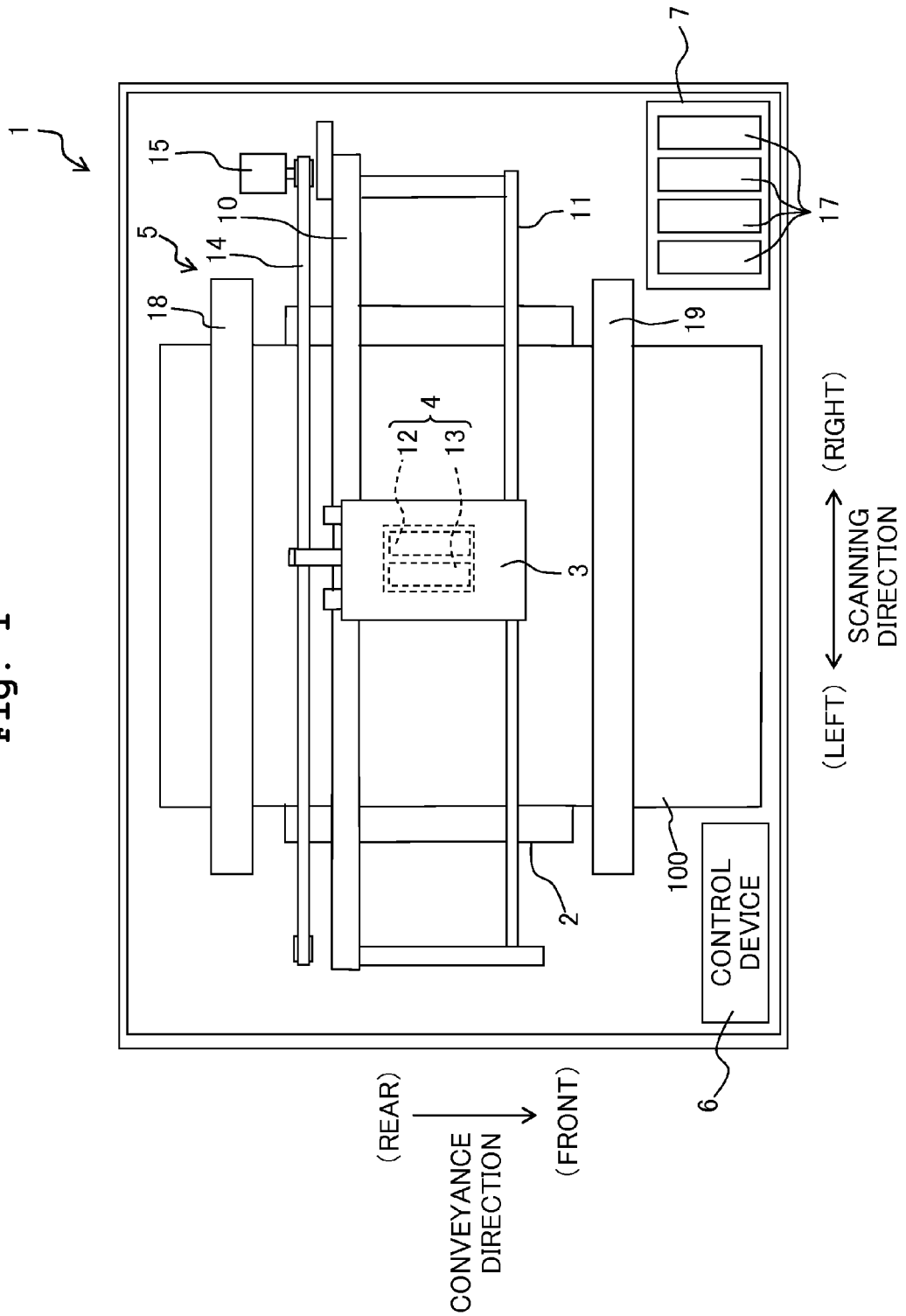
FIG. 1 is a schematic plan view of a printer according to an embodiment.

An embodiment of this teaching will be described. FIG. 1 is a schematic plan view of a printer according to this embodiment. First, a schematic structure of an ink-jet printer 1 will be explained with reference to FIG. 1. Note that front, rear, left, and right directions indicated in FIG. 1 are defined as "front", "rear", "left", and "right" of the printer 1 respectively. Further, the near side of the paper is defined as "an upper side" of the printer 1 and the far side of the paper is defined as "a lower side" of the printer 1. Hereinafter, the front, rear, left, right, upper, and lower directions will be used as required in the explanation.

(Schematic Structure of Printer)

As depicted in FIG. 1, the ink-jet printer 1 includes a platen 2, a carriage 3, an ink-jet head 4, a conveyance mechanism 5, a control device 6, and so on.

On the upper surface of the platen 2, a recording sheet 100 being a recording medium is placed. In a region facing the platen 2, the carriage 3 is reciprocatable in a scanning direction along two guide rails 10, 11. An endless belt 14 is coupled to the carriage 3. The endless belt 14 is driven by a carriage drive motor 15, and by doing so, the carriage 3 is moved in the scanning direction.

The ink-jet head 4 is attached on the carriage 3 and moves in the scanning direction together with the carriage 3. The ink-jet head 4 is connected, by tubes (not depicted), to a cartridge holder 7 on which ink cartridges 17 for four colors (black, yellow, cyan, magenta) are installed. The ink-jet head 4 includes two head units 12, 13 arranged in the scanning direction. On lower surfaces (the surfaces arranged on far-side of the paper in FIG. 1) of the head units 12, 13, a plurality of nozzles 24 (see FIG. 2 to FIG. 4) which jets the inks toward the recording sheet 100 placed on the platen 2 is formed. Out of the two head units 12, 13, the head unit 12 jets the black and yellow inks, and the other head unit 13 jets the cyan and magenta inks.

The conveyance mechanism 5 has two conveyance rollers 18, 19 arranged such that the platen 2 is arranged therebetween in a conveyance direction. The conveyance mechanism 5 conveys the recording sheet 100 placed on the platen 2 in the conveyance direction by the two conveyance rollers 18, 19.

The control device 6 includes a ROM (Read Only Memory), a RAM (Random Access Memory), an ASIC (Application Specific Integrated Circuit) including various control circuits, and so on. The control device 6 executes various processes such as printing onto the recording sheet 100 by the ASIC according to programs stored in the ROM. For example, in the printing process, based on a print command input from an external device such as a PC, the control device 6 controls the head units 12, 13 of the ink-jet head 4, the carriage drive motor 15, and so on to have an image etc. printed on the recording sheet 100. Concretely, the control device 6 causes an alternate execution of an ink jetting operation in which the ink is jetted while the ink-jet head 4 is moved in the scanning direction together with the carriage 3, and a conveyance operation in which the recording sheet 100 is conveyed by a predetermined distance in the conveyance direction by the conveyance rollers 18, 19.

(Details of Head Units of Ink-Jet Head)

Figure 2:
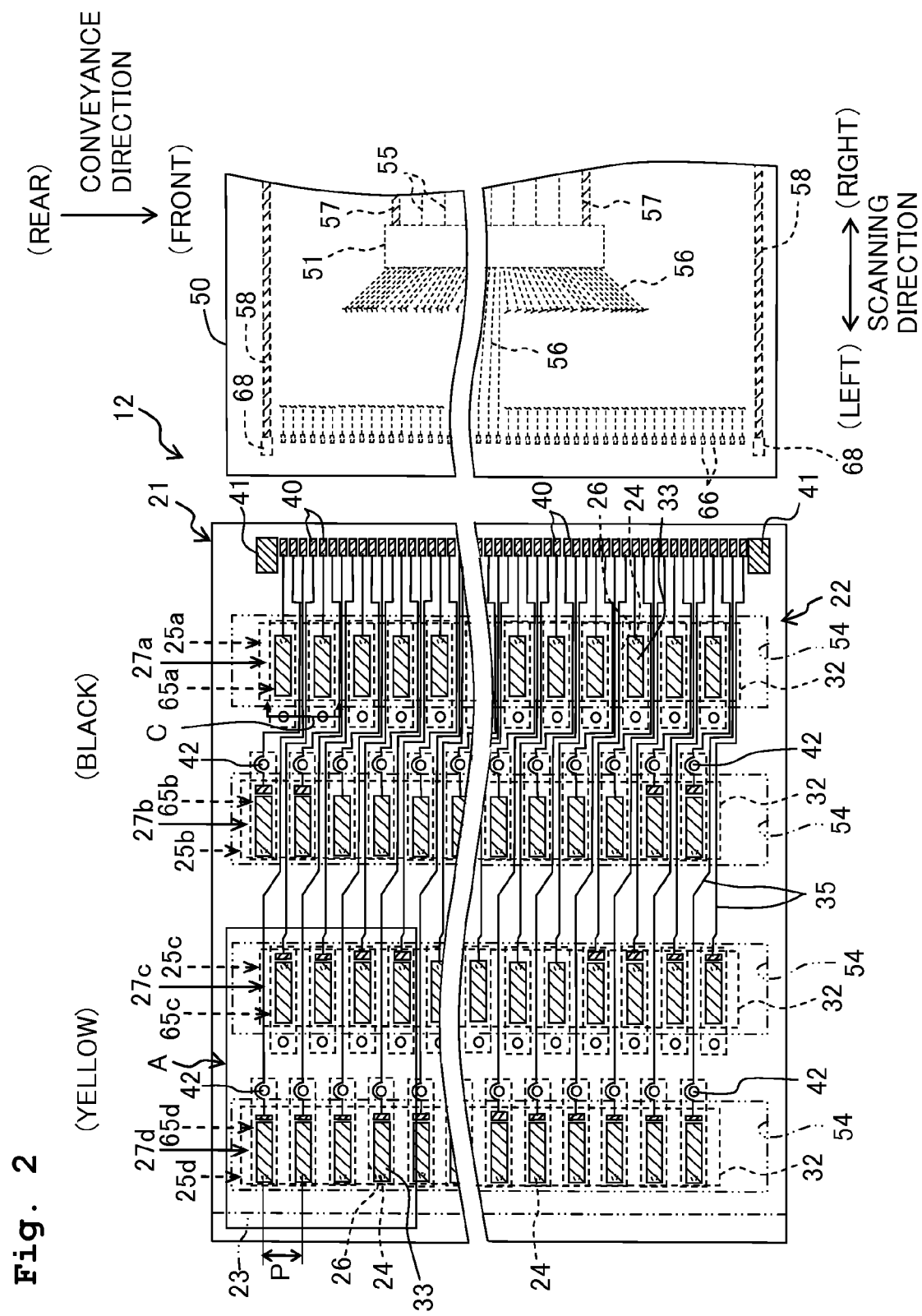
FIG. 2 is a top view of a head unit of an ink-jet head.
Figure 3:
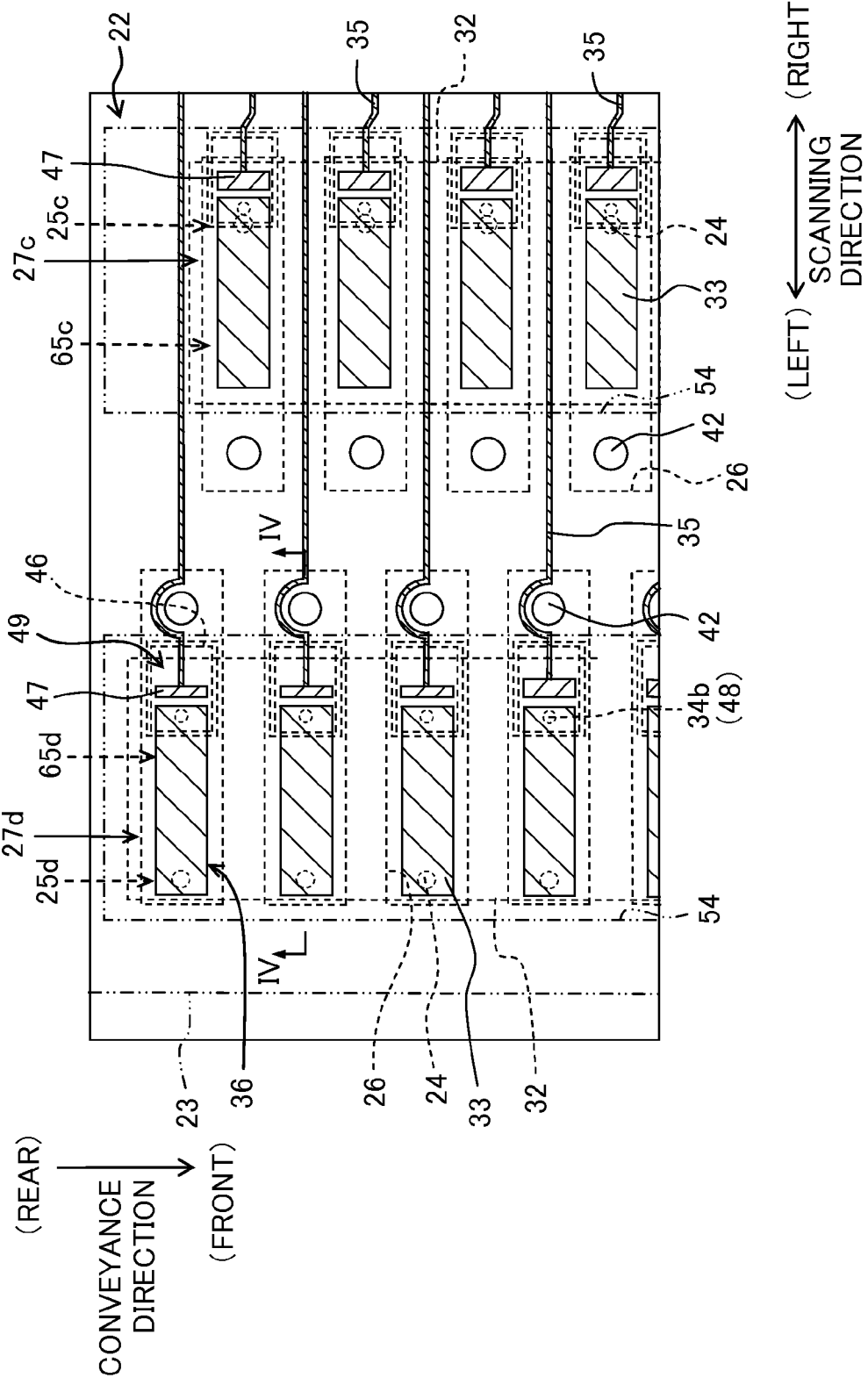
FIG. 3 is an enlarged view of a portion A in FIG. 2.
Figure 4:
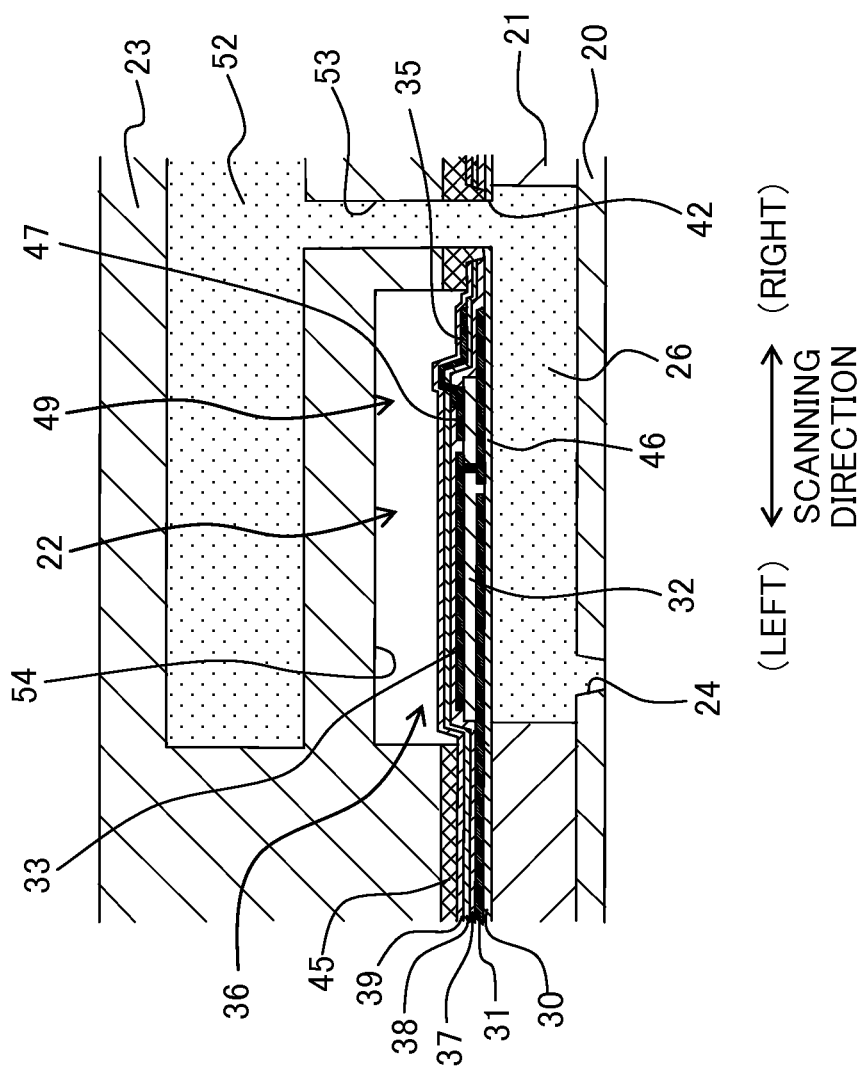
FIG. 4 is a cross-sectional view of the head unit taken along a line IV-IV in FIG. 3.
Figure 5:
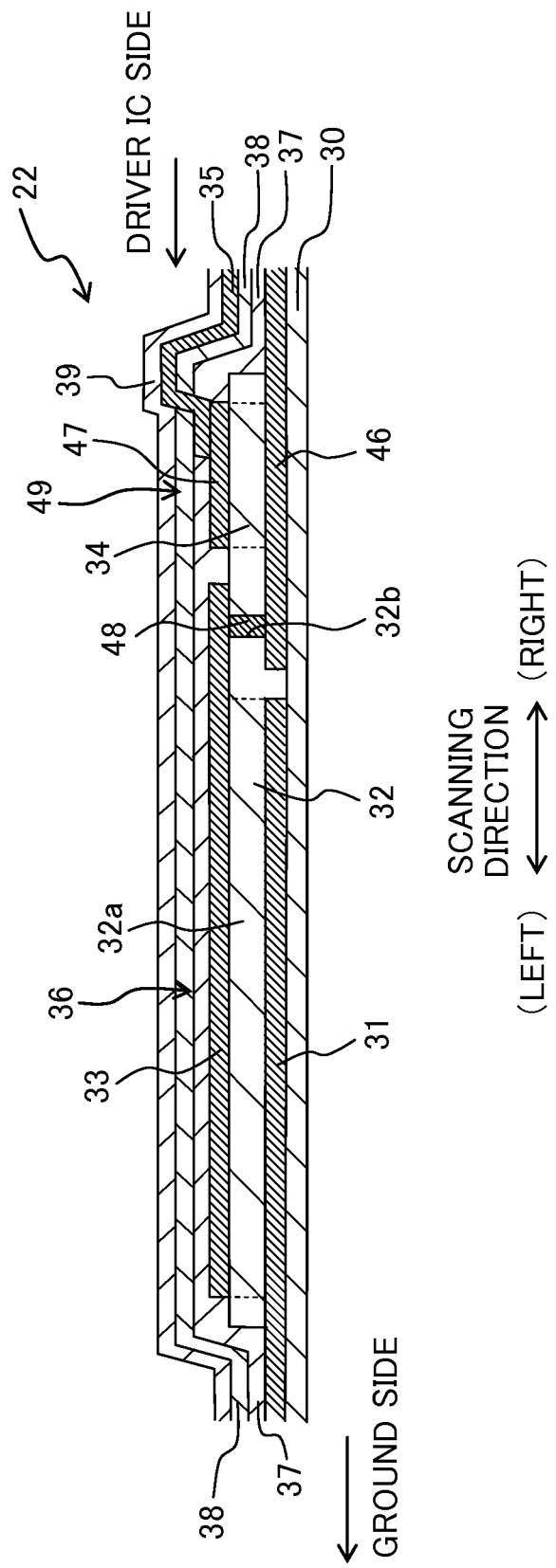
FIG. 5 is an enlarged cross-sectional view of a piezoelectric actuator in FIG. 4.

Next, a detailed structure of the head units 12, 13 of the ink-jet head 4 will be explained. Since the two head units 12, 13 have the same structure, the head unit 12 which jets the black and yellow inks are representatively explained in the below. FIG. 2 is a top view of the head unit 12 of the ink-jet head 4. FIG. 3 is an enlarged view of a portion A in FIG. 2. FIG. 4 is a cross-sectional view taken along a line IV-IV in FIG. 3, and FIG. 5 is an enlarged cross-sectional view of part of a piezoelectric actuator of FIG. 4. As depicted in FIG. 2 to FIG. 5, the head unit 12 includes a nozzle plate 20, a channel forming member 21, the piezoelectric actuator 22, and a reservoir forming member 23. Note that, in FIG. 2 and FIG. 3, as for the reservoir forming member 23 located above the channel forming member 21 and the piezoelectric actuator 22, only its outer shape is depicted by the two-dot chain line, for simplification of the drawings.

(Nozzle Plate)

The nozzle plate 20 is formed of a metal material such as stainless steel, silicon, a synthetic resin material such as polyimide, or the like. As depicted in FIG. 4, in the nozzle plate 20, the plurality of nozzles 24 are formed. As depicted in FIG. 2, the nozzles 24 are aligned in the conveyance direction to form four nozzle rows 25a, 25b, 25c, 25d arranged in the scanning direction. The two right nozzle rows 25a, 25b are nozzle rows which jet the black ink. Positions of the nozzles 24 in the nozzle row 25a and positions of the nozzles 24 in the nozzle row 25b are deviated respectively, in the conveyance direction, by a half (P/2) of an arrangement pitch P of each nozzle row. The two left nozzle rows 25c, 25d are nozzle rows which jet the yellow ink. As for the two nozzle rows 25c, 25d for the yellow ink, similarly to the nozzle rows 25a, 25b for the black ink, positions of the nozzles 24 in the nozzle row 25c and positions of the nozzles 24 in the nozzle row 25d are deviated, respectively, by P/2 in the conveyance direction.

(Channel Forming Member)

The channel forming member 21 is formed of silicon. The aforesaid nozzle plate 20 is bonded to the lower surface of the channel forming member 21. In the channel forming member 21, a plurality of pressure chambers 26 communicating with the plurality of nozzles 24 respectively are formed. The pressure chambers 26 each have a rectangular shape, in plan view, that is long in the scanning direction. The pressure chambers 26 are aligned in the conveyance direction according to the alignment of the nozzles 24 to form four pressure chamber rows 27a, 27b, 27c, 27d arranged in the scanning direction. The two right pressure chamber rows 27a, 27b are pressure chamber rows for the black ink, and the two left pressure chamber rows 27c, 27d are pressure chamber rows for the yellow ink. In the left pressure chamber row 27b (27d) out of the two pressure chamber rows which jet the ink of the same color, left end portions of the pressure chambers 26 overlap with the nozzles 24 respectively, and in the right pressure chamber row 27a (27c), right end portions of the pressure chambers 26 overlap with the nozzles 24 respectively. Further, as for the pressure chamber rows 27a and 27b for black ink, positions of the pressure chambers 26 of the pressure chamber row 27a and positions of the pressure chambers 26 of the pressure chamber row 27b are deviated, respectively, by P/2 in the conveyance direction. And also, as for the pressure chamber rows 27c and 27d for yellow ink, positions of the pressure chambers 26 of the pressure chamber row 27c and positions of the pressure chambers 26 of the pressure chamber row 27d are deviated, respectively, by P/2 in the conveyance direction.

(Piezoelectric Actuator)

The piezoelectric actuator 22 applies, to the inks in the pressure chambers 26, jetting energy for causing the inks to be jetted from the respective nozzles 24. The piezoelectric actuator 22 is provided on the upper surface of the channel forming member 21 so as to cover the pressure chambers 26. As depicted in FIG. 2 to FIG. 5, the piezoelectric actuator 22 includes a vibration plate 30, lower electrodes 31, lower capacitor electrodes 46, piezoelectric bodies 32, upper electrodes 33, upper capacitor electrodes 47, drive wires 35, and so on. Note that, the piezoelectric actuator 22 of this embodiment is formed by the layers being formed in order on an upper surface of a silicon substrate which becomes the channel forming member 21, by a well-known semiconductor process technique.

The vibration plate 30 is disposed on the entire area of the upper surface of the channel forming member 21 so as to cover the plurality of pressure chambers 26. The vibration plate 30 is formed of a silicon oxide film ($SiO_2$), a silicon nitride film (SiN), or the like. In the vibration plate 30, communication holes 42 are formed at end portions of the pressure chambers 26 respectively, the end portion being defined at a side of the pressure chamber 26 opposite to a side at which the nozzle 24 is formed. Note that each communication hole 42 is small enough to be disposed within each pressure chamber 26 in a plan view as depicted in FIG. 3 and FIG. 4.

The lower electrodes 31 are formed of a conductive material. The lower electrodes 31 are formed on substantially the entire upper surface of the vibration plate 30 and the lower electrodes 31 face the pressure chambers 26 in common. In other words, the lower electrodes 31 serve as a common electrode in which a plurality of electrode portions facing the pressure chambers respectively are connected to be integrated. Further, as depicted in FIG. 2 to FIG. 5, on the upper surface of the vibration plate 30, the lower capacitor electrodes 46 are disposed in regions overlapping with some pressure chambers 26 among the pressure chambers 26 respectively. Note that the lower capacitor electrodes 46 are separated from the lower electrodes 31.

The four piezoelectric bodies 32 are disposed above the upper surface of the vibration plate 30 on which the lower electrodes 31 are formed, so as to correspond to the four pressure chamber rows 27a to 27d respectively. The piezoelectric bodies 32 each extends in the conveyance direction so as to extend over the pressure chambers 26 forming the single pressure chamber row. The piezoelectric bodies 32 are formed of a piezoelectric material whose main component is, for example, lead zirconate titanate (PZT) which is a mixed crystal of lead titanate and lead zirconate. Note that, the piezoelectric material such as PZT is a high-dielectric constant material having a high dielectric constant.

On upper surfaces of the piezoelectric bodies 32, the upper electrodes 33 are formed in portions overlapping with the pressure chambers 26, respectively. The upper electrodes 33 each have a rectangular shape in plan view that is long in the scanning direction. On the upper surfaces of the piezoelectric bodies 32, the upper capacitor electrodes 47 facing the lower capacitor electrodes 46 across the piezoelectric bodies 32 are disposed in regions overlapping with some pressure chambers 26, among the pressure chambers 26, respectively. The upper capacitor electrodes 47 are disposed on the right of the upper electrodes 33 and are separated from the upper electrodes 33. Further, as depicted in FIG. 3 to FIG. 5, in each piezoelectric body 32, through holes 32b are formed in regions overlapping with the aforesaid some pressure chambers 26, respectively. The upper electrodes 33 located on the upper side of each piezoelectric body 32 and the lower capacitor electrodes 46 located on the lower side of each piezoelectric body 32 are in electrical continuity with each other via conduction parts 48 made of a conductive material filled in the through holes 32b.

In the piezoelectric bodies 32, a portion sandwiched by each upper electrode 33 and the lower electrode 31 is polarized in a downward direction in a thickness direction, that is, in a direction from the upper electrode 33 toward the lower electrode 31. In the piezoelectric bodies 32, the aforesaid polarized portions are especially referred to as activators 32a. Further, the single activator 32a in the piezoelectric bodies 32, and the upper electrode 33 and the lower electrode 31 which sandwich this activator 32a form one piezoelectric element 36 disposed to face the single pressure chamber 26 across the vibration plate 30. A plurality of the piezoelectric elements 36 are aligned in the conveyance direction according to the alignment of the pressure chambers 26 and form four piezoelectric element rows 65a, 65b, 65c, 65d arranged in the scanning direction.

Further, in a portion facing each of some pressure chambers 26 among the pressure chambers 26, a part 34 of the piezoelectric bodies 32 is sandwiched by each upper capacitor electrode 47 and each lower capacitor electrode 46. The aforesaid part 34 of the piezoelectric body 32 formed of the high-dielectric constant material, and the upper capacitor electrode 47 and the lower capacitor electrode 46 which sandwich this part form one capacitor 49. That is, on the right of each of some piezoelectric elements 36 of the piezoelectric actuator 22, the capacitor 49 having the insulator 34 formed of the same piezoelectric material as that of the activators 32a of these piezoelectric elements 36 is provided. As is apparent from the previous explanation, the insulators 34 and the activators 32 are disposed on the same plane and the activators 32a and the insulators 34 are integrated to form the piezoelectric bodies 32. The insulators 34 are formed simultaneously with forming of the piezoelectric bodies 32 in a process of forming the piezoelectric bodies 32. Reasons why the capacitors 49 are provided only for the some piezoelectric elements 36 will be explained later.

As depicted in FIG. 4 and FIG. 5, on the upper surface of the vibration plate 30, two protective layers 37, 38 are formed so as to cover the lower electrode 31, the piezoelectric bodies 32, and the upper electrodes 33. Note that, in FIG. 2 and FIG. 3, the depiction of the protective layers 37, 38 is omitted for simplification of the drawings. The protective layer 37 is formed of alumina ($Al_2O_3$) or an insulator such as a silicon nitride film. Further, the protective layer 38 is formed of an insulator such as a silicon oxide film. Note that, the number of the protective layers 37, 38 need not be two, and only the single protective layer 38 formed of the silicon oxide film or the like may be formed.

On the upper surface of the protective layer 38, it is provided a plurality of drive wires 35 for supplying drive signals output from a driver IC 51 (to be described later) to the plurality of piezoelectric elements 36, respectively. As depicted in FIG. 2 and FIG. 3, as for the piezoelectric elements 36 for which the aforesaid capacitors 49 are not provided, the drive wire 35 is directly connected to the upper electrode 33 of each of these piezoelectric elements 36. On the other hand, as for the piezoelectric elements 36 for which the capacitors 49 are provided respectively, the drive wire 35 is connected to each of the upper capacitor electrodes 47.

As depicted in FIG. 2, FIG. 4, and FIG. 5, each of the drive wires 35 is connected to the upper surface of the upper electrode 33 or the upper capacitor electrode 47, and extends rightward from the upper electrode 33 or the upper capacitor electrode 47. The drive wires 35 are covered by a protective layer 39 formed of a silicon oxide film or the like (FIG. 4, FIG. 5). Note that, in FIG. 2 and FIG. 3, the depiction of the protective layer 39 is omitted. As depicted in FIG. 2 and FIG. 3, on the upper surface of the right end portion of the piezoelectric actuator 22, a plurality of drive contact portions 40 are aligned in one row in the conveyance direction. The drive wires 35 are connected to the drive contact portions 40 located on the right end portion of the channel forming member 21, respectively. Further, on both sides of the drive contact portions 40 in the conveyance direction, two ground contact portions 41 connected to the lower electrodes 31 are disposed.

Note that, as depicted in FIG. 2, each drive wire 35 extends rightward from each piezoelectric element 36 passes between the two piezoelectric elements 36 in each of the piezoelectric element rows 65a, 65b, 65c located on the right side of the piezoelectric element 36 from which the drive wire 35 extends, and is connected to the drive contact portion 40. Therefore, between the two piezoelectric elements 36 included in the piezoelectric element row 65a located on the right end among the four piezoelectric element rows 65a to 65d, it is necessary to pass the three drive wires 35 extend from the three left piezoelectric element rows 65b to 65d respectively. These three drive wires 35 may be arranged in the conveyance direction, but when a space between the two piezoelectric elements 36 in the conveyance direction is narrow, spaces among the three drive wires 35 become very narrow, and thus there is a fear that a short circuit or migration among the drive wires 35 may occur.

Figure 6:
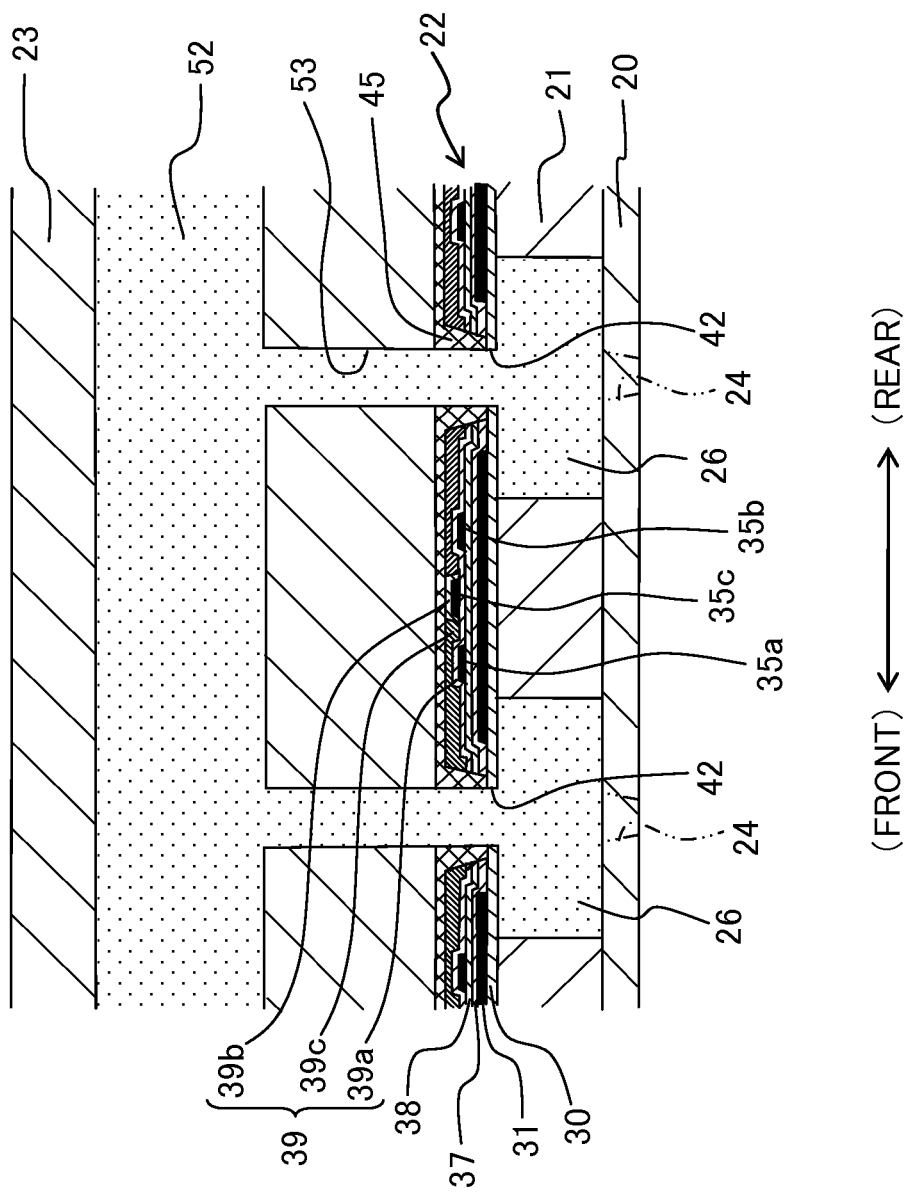
FIG. 6 is a cross-sectional view along a line indicated by a reference C in FIG. 2.

FIG. 6 is a cross-sectional view along a line indicated by a reference C in FIG. 2. In this embodiment, as depicted in FIG. 6, three drive wires 35a, 35b, 35c are disposed so that their height positions from the vibration plate 30 (positions in an up and down direction orthogonal to the vibration plate) differ. Concretely, first, on the upper surface of the protective layer 38, the two drive wires 35a, 35b are disposed. These two drive wires 35a, 35b are covered by a protective layer 39a. On the upper surface of the protective layer 39a, the other drive wire 35c is disposed in a region between the two drive wires 35a, 35b. This center drive wire 35c is covered by a protective layer 39b.

The height position from the vibration plate 30 is thus made different among the three drive wires 35a to 35c. That is, by disposing the three drive wires 35a to 35c in a limited region so that they are apart from one another in the height direction, it is possible to make the adjacent drive wires 35 apart from each other, and it is possible to prevent the short circuit and the migration. Note that, the two drive wires 35 which pass between the two piezoelectric elements 36 in the piezoelectric element row 65b located second from the right may also differ in the height position, similarly to the above.

Further, the three drive wires 35a to 35c are covered by the protective layers 39a, 39b, but since the height position of the center drive wire 35c is high, the protective layer 39b has a shape whose center portion projects than its surroundings. Accordingly, when an external force acts on the protective layer 39b, for example, when a reservoir forming member 23 (to be described later) is pressed against the piezoelectric actuator 22 to be bonded, a stress concentrates on the aforesaid projecting portion, which is likely to cause breakage of the protective layer 39b and the structure protected by the protective layer 39b. Therefore, as depicted in FIG. 6, it is preferable to cover portions of the protective layer 39a by other protective layer 39c, the portions covering the two drive wires 35a, 35b which are arranged on the both sides of the drive wire 35c and which have low height position. By doing so, while the height positions of the three drive wires 35a to 35c are made different, upper surfaces of the protective layers 39b, 39c become substantially flush, and thus, it is possible to prevent the stress concentration.

A COF (Chip On Film) 50 being a wiring member is bonded to the upper surface of the right end portion of the piezoelectric actuator 22 (FIG. 2). Note that, in FIG. 2, the COF 50 is intentionally deviated rightward from the piezoelectric actuator 22 for easier view of the drawing, but actually, the COF 50 is disposed so that its left end portion overlaps with the right end portion of the piezoelectric actuator 22. The COF 50 has the driver IC 51, and a plurality of input wires 55 and a plurality of output wires 56 which are connected to the driver IC 51. One end portion of the COF 50 is connected to the control device 6 (see, FIG. 1) of the printer 1, and the other end portion of the COF 50 is connected to the upper surface of the right end portion of the piezoelectric actuator 22. Accordingly, the driver IC 51 is electrically connected to the control device 6 via the input wires 55. Further, the input wires 55 include power supply lines 57 to which a predetermined drive potential is applied, and the power supply lines 57 are also connected to the driver IC 51. Further, a plurality of output terminals 66 are provided on tip portions of the plurality of output wires 56 respectively, and these output terminals 66 are connected to the plurality of drive contact portions 40 of the piezoelectric actuator 22, respectively. That is, the driver IC 51 is electrically connected to the drive contact portions 40 of the piezoelectric actuator 22 via the output wires 56.

Note that the driver IC 51 is disposed at a center portion of the COF 50 in terms of a width direction. The plurality of output wires 56 from the left side of the driver IC 51 extend toward the plurality of drive contact portions 40, respectively, while fanning out. Therefore, the output wires 56 are not equal in length. Specifically, the output wires 56 on front and rear ends are larger in wiring length than the center output wire 56.

Based on a control signal sent from the control device 6, the driver IC 51 generates and outputs the drive signals for driving the piezoelectric elements 36. Each drive signal output from the driver IC 51 is input to each drive contact portion 40 via each output wire 56 of the COF 50 and is further supplied to each piezoelectric element 36 via each drive wire 35 of the piezoelectric actuator 22. A potential of the upper electrode 33 supplied with the drive signal changes between a predetermined drive potential and a ground potential.

Further, two ground wires 58 are formed on the COF 50. At tip portions of the two ground wires 58, ground terminals 68 are provided respectively. These two ground terminals 68 are connected to the two ground contact portions 41 of the piezoelectric actuator 22, respectively. Further, the two ground contact portions 41 are kept at the ground potential. Therefore, potentials of the lower electrodes 31 connected to the two ground contact portions 41 are also constantly kept at the ground potential.

An operation of the piezoelectric element 36 when the drive signal is supplied from the driver IC 51 will be explained. In a state in which the drive signal is not supplied, the potential of the upper electrodes 33 of the piezoelectric elements 36 is the ground potential and is equal to the potential of the lower electrodes 31. From this state, when the drive signal is supplied to the upper electrode 33 of certain one of the piezoelectric elements 36 and the drive potential is applied to the upper electrode 33, an electric field parallel to the thickness direction of the activator 32$a$ of the piezoelectric element 36 acts on the activator 32$a$ due to a potential difference between the upper electrode 33 and the lower electrode 31. Here, since the polarization direction of the activator 32$a$ is the same as the direction of the electric field, the activator 32$a$ extends in the thickness direction being its polarization direction and contracts in a planar direction. In accordance with the contraction deformation of the activator 32$a$, the vibration plate 30 bends so as to bulge toward the pressure chamber 26. Consequently, a volume of the pressure chamber 26 reduces and a pressure wave is generated in the pressure chamber 26, so that droplets of the ink are jetted from the nozzle 24 communicating with the pressure chamber 26.

Manufacturing processes of the above-described piezoelectric actuator 22 will be briefly explained with reference to FIG. 5. First, the vibration plate 30 is formed by oxidation or nitridation treatment applied to one surface of a silicon substrate which becomes the channel forming member 21. By film formation and patterning of a conductive material, the lower electrodes 31 and the lower capacitor electrodes 46 are formed on the upper surface of the vibration plate 30. Next, by film formation and patterning of the piezoelectric material, the piezoelectric bodies 32 including the activators 32$a$ and the insulators 34 are formed so as to cover the respective lower electrodes 31 and the respective lower capacitor electrodes 46. Note that, by the patterning at this time, the through holes 32$b$ are also formed in the piezoelectric bodies 32 simultaneously with the forming of the activators 32$a$ and the insulators 34.

Next, on the upper surfaces of the piezoelectric bodies 32, the upper electrodes 33 and the upper capacitor electrodes 47 are formed by film formation and patterning of a conductive material. Note that, when the upper electrodes 33 and so on are formed, the conductive material is deposited so that the conduction parts 48 are formed on side surfaces and bottom surfaces in the through holes 32$b$ continuously from the upper electrodes 33. In this case, the upper electrodes 33 and so on and the conduction parts 48 are formed at the same time. Thereafter, the protective layer 37, the protective layer 38, the drive wires 35, and the protective layer 39 are stacked in this order. Note that, the conduction parts 48 may be formed first by performing a process of filling the conductive material in the through holes 32$b$ before the formation of the upper electrodes 33 and so on.

(Reservoir Forming Member)

The reservoir forming member 23 is disposed on an opposite side (upper side) of the channel forming member 21 across the piezoelectric actuator 22 and is bonded to the upper surface of the piezoelectric actuator 22 by an adhesive 45. Similarly to the channel forming member 21, the reservoir forming member 23 may be formed of silicon, for instance, but may be formed of a material other than silicon, for example, a metal material or a synthetic resin material.

In an upper half portion of the reservoir forming member 23, two reservoirs 52 each of which extends in the feed direction and which are arranged in the scanning direction are formed. The two reservoirs 52 are connected to the cartridge holder 7 (see, FIG. 1) in which the ink cartridges 17 are installed, by the tubes (not depicted) respectively. The black ink is supplied to one of the two reservoirs 52 and the yellow ink is supplied to the other reservoir 52.

In a lower half portion of the reservoir forming member 23, a plurality of ink supply channels 53 extending downward from each of the reservoirs 52 are formed. The reservoir forming member 23 is bonded to peripheral regions of the communication holes 42 of the piezoelectric actuator 22. Consequently, the ink supply channels 53 of the reservoir forming member 23 communicate with the communication holes 42 of the piezoelectric actuator 22, respectively. The ink in each reservoir 52 is supplied to the plurality of pressure chambers 26 of the channel forming member 21 via the plurality of ink supply channels 53 and the plurality of communication holes 42. Further, in the lower half portion of the reservoir forming member 23, four protective cover parts 54 in a dented shape are also formed covering the four piezoelectric element rows 65$a$ to 65$d$ of the piezoelectric actuator 22, respectively.

(Regarding Capacitors 49 Connected to Piezoelectric Elements 36)

Next, regarding the capacitors 49 serially connected to some of the piezoelectric elements 36, reasons why they are provided, their concrete structures, and so on will be explained below.

As the premise for providing the capacitors 49, first, in this embodiment, the total length of the wire connecting the driver IC 51 which outputs the drive signal and the piezoelectric element 36 is different among the plurality of piezoelectric elements 36 of the piezoelectric actuator 22, as will be described in the following (1), (2).

(1) Difference of the Lengths of the Drive Wires 35 of the Piezoelectric Actuator 22

As depicted in FIG. 2, the piezoelectric elements 36 of the piezoelectric actuator 22 form the four piezoelectric element rows 65$a$ to 65$d$ arranged in the left and right direction. Further, on the right end portion of the piezoelectric actuator 22, the plurality of drive contact portions 40 are disposed. Accordingly, a distance up to the drive contact portions 40 is different among the four piezoelectric element rows 65$a$ to 65$d$. Therefore, as the distance from the drive contact portion 40 is longer, the length of the drive wires 35 connected to the piezoelectric elements 36 become longer. That is, the length of the drive wires 35 connected to the piezoelectric elements 36 become longer, in order of the piezoelectric element row 65a, the piezoelectric element row 65b, the piezoelectric element row 65c, and the piezoelectric element row 65d. Consequently, the total length of the wire between the piezoelectric element 36 and the driver IC 51 differ among the four piezoelectric element rows 65a to 65d.

(2) Difference of the Lengths of the Output Wires 56 of the COF 50

As depicted in FIG. 2, since the driver IC 51 is disposed at the center portion of the COF 50 in terms of the width direction (front and rear direction), the plurality of output wires 56 of the COF 50 extend from the driver IC 51 toward the plurality of drive contact portions 40, respectively, while fanning out. Namely, the output wires 56 of the COF 50 corresponding to the piezoelectric elements 36 located at end portions in the arrangement-direction of the piezoelectric element row, among the piezoelectric elements 36 forming the single piezoelectric element row, are longer in wiring length than the output wires 56 of the COF 50 corresponding to the piezoelectric elements 36 located on a center portion in terms of the arrangement direction. Accordingly, the total length of the wire between the piezoelectric element 36 and the driver IC 51 differs also among the plurality of piezoelectric elements 36 forming the single piezoelectric element row.

When the total length of the wire connecting the piezoelectric element 36 and the driver IC 51 differs among the plurality of piezoelectric elements 36, in the piezoelectric element 36 whose wire has a long length, a wiring resistance becomes large and accordingly, a waveform of the drive signal output from the driver IC 51 becomes dull. That is, responsiveness to the drive signal worsens. When the responsiveness to the drive signal differs among the plurality of piezoelectric elements 36, a jetting velocity becomes different or a jetting amount becomes different among the plurality of nozzles 24 corresponding to the plurality of piezoelectric elements 36 respectively, and thus, printing quality deteriorates. Therefore, in this embodiment, the capacitors 49 are connected to the piezoelectric elements 36, respectively, the piezoelectric elements being connected to wires having long lengths, in order to improve the responsiveness of the piezoelectric elements to the drive signals.

Figure 7:
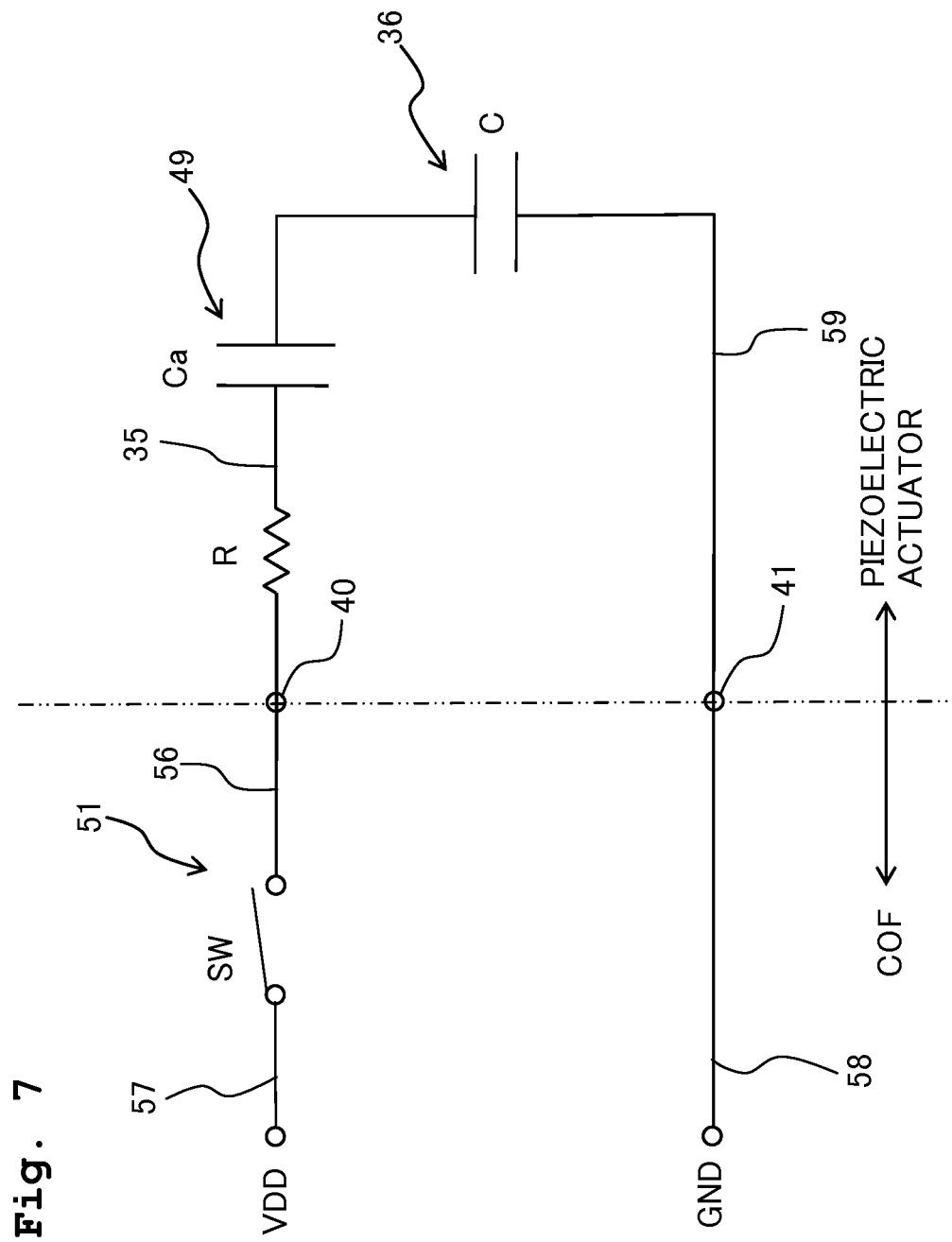
FIG. 7 is an equivalent circuit of one circuit loop which drives one piezoelectric element.

FIG. 7 depicts an equivalent circuit of one circuit loop which drives the single piezoelectric element 36. The single piezoelectric element 36 is an element in which the activator 32a, of the piezoelectric body 32, being the high dielectric constant material is sandwiched by the upper electrode 33 and the lower electrode 31, and can be regarded as a kind of capacitor having a certain capacitance C. Further, the total resistance of wires 56, 35 from the driver IC 51 up to the piezoelectric element 36 via the drive contact portion 40 and wires 59, 58 from the piezoelectric element 36 up to the ground (GND) via the ground contact portion 41 is defined as R.

Further, the driver IC 51 is an element which changes the potential of the upper electrode 33 of the piezoelectric element 36 between the drive potential and the ground potential by supplying the drive signal to the piezoelectric element 36, and this element can be substituted with a switch SW with which the wire 56 is connected to and disconnected from a power source VDD, which applies the drive potential, and the power supply line 57. From the above, the single circuit loop which drives the single piezoelectric element 36 can be regarded as an RC series circuit in which a resistor with the electrical resistance R and the capacitor with the capacitance C are serially connected, as depicted in FIG. 7.

When the switch SW equivalent to the driver IC 51 is turned on, a current supplied from the power source VDD flows in the circuit, so that the capacitor equivalent to the piezoelectric element 36 is electrically charged, and in accordance with this, the potential of the upper electrode 33 of the piezoelectric element 36 increases. Then, when the charging is completed, the potential of the upper electrode 33 reaches the drive potential. In this state, the electric field acts on the activator 32a of the piezoelectric element 36 sandwiched by the upper electrode 33 and the lower electrode 31 to cause the deformation of the piezoelectric element 36.

Here, when the total length of the wire between the driver IC 51 and the piezoelectric element 36 is long, the resistance R in FIG. 7 becomes large. Further, a time constant, of the RC series circuit, which indicates responsiveness of the circuit, is expressed by RC. That is, when the resistance R is large, by reducing the capacitance C of the whole circuit, it is possible to reduce the time constant to enhance the responsiveness of the circuit. Therefore, in this embodiment, regarding some of the piezoelectric elements 36 whose wires up to the driver IC 51 have long total lengths, the capacitors 49 (electrostatic capacitance Ca) are connected to the drive wires 35, respectively, each of the drive wires connecting the piezoelectric element 36 concerned and the drive contact portion 40, such that the capacitors 49 are serially connected to the piezoelectric elements 36, respectively.

The structure of the capacitors 49, which is briefly described above, is concretely as follows. As depicted in FIG. 4 and FIG. 5, the capacitors 49 each have the insulator 34 being part of the piezoelectric body 32, the lower capacitor electrode 46 disposed on the insulator 34 on a side toward the vibration plate 30, and the upper capacitor electrode 47 disposed on the insulator 34 on a side opposite to the side toward the vibration plate 30. The lower capacitor electrodes 46 are each in electric continuity with the upper electrode 33 of the adjacent piezoelectric element 36 by the conduction part 48 formed of the conductive material in the through hole 32b of the piezoelectric element 32. Further, the upper capacitor electrodes 47 are connected to the drive wires 35.

Next, concrete positions where the capacitors 49 are provided will be explained. The positions of the capacitors 49 are decided from the two viewpoints, that is, the length difference of the drive wire 35 of the piezoelectric actuator 22 among the four piezoelectric element rows 65a to 65d, explained in the above (1), and the length difference of the output wire 56 of the COF 50 among the plurality of piezoelectric elements 36 in the single piezoelectric element row, explained in the above (2).

As described in the above (1), (2), the drive wires 35 corresponding to the piezoelectric element row located more on the left side and more distant from the drive contact portions 40, among the four piezoelectric element rows 65a to 65d, have longer lengths. The output wire 56 corresponding to the piezoelectric element 36 located closer to the end portion in the arrangement direction, among the plurality of piezoelectric elements 36 in each of the piezoelectric element rows, has a longer length.

Therefore, first, the capacitors 49 are provided only for the three piezoelectric element rows 65b to 65d located at a side opposite to a side at which the drive contact portions 40 are arranged (that is, on the left side), among the four piezoelectric element rows 65a to 65d.

For the leftmost piezoelectric element row 65d, the capacitors 49 are serially connected respectively to all the piezoelectric elements 36 forming the piezoelectric element row 65d. The lengths of the drive wires 35 for the piezoelectric element row 65c located second from the left are shorter than those for the piezoelectric element row 65d. Therefore, the capacitors 49 are connected only to total eight piezoelectric elements 36, the eight piezoelectric elements being located on both end portions, four per one end portion, in the arrangement direction, the eight piezoelectric elements being connected to long output wires 56, respectively. Since the lengths of the drive wires 35 for the piezoelectric element row 65*b* located third from the left are still shorter, the capacitors 49 are connected only to total four piezoelectric elements 36 located on both end portions, two per one end portion, in the arrangement direction.

As described above, in this embodiment, among the plurality of piezoelectric elements 36 of the piezoelectric actuator 22, some of the piezoelectric elements 36, each of which is connected to the driver IC 51 by the wire having long total length is provided with the capacitor 49 as follows. That is, the capacitors 49 are connected to the drive wires 35 connecting the piezoelectric elements 36 concerned and the drive contact portions 40 such that the capacitors 49 are serially connected to the piezoelectric elements 36 concerned, respectively. That is, in each circuit from the driver IC 51 up to the ground via the drive contact portion 40 and the piezoelectric element 36, the other capacitor 49 is added in series to the piezoelectric element 36, so that the resultant capacitance of the whole circuit becomes small. Accordingly, the time constant of each circuit becomes small, so that voltage (potential difference) applied to the piezoelectric body of the piezoelectric element 36 changes fast when the drive signal is supplied. Consequently, since, for this piezoelectric element 36, the deterioration of the responsiveness to the drive signal due to the long wire is suppressed, variation in the responsiveness to the drive signal due to a difference in the wiring resistance becomes small among the plurality of piezoelectric elements 36. Further, the capacitors 49 each has the insulator 34 formed of the same piezoelectric material as that of the activator 32*a* of the piezoelectric element 36. Therefore, the activators 32*a* of the piezoelectric elements 36 and the insulators 34 of the capacitors 49 can be formed in the same process.

Further, in this embodiment, not all the capacitors 49 are equal in capacitance, but the capacitors 49 differ in electrostatic capacitance, depending on the length of the wire connecting the piezoelectric element 36 and the driver IC 51. Consequently, the variation in the responsiveness to the drive signal becomes smaller among the piezoelectric elements 36. Note that, in this embodiment, the upper capacitor electrodes 47 are made different in electrode area in order to make the capacitors 49 different in electrostatic capacitance. Of course, it is also possible to increase the electrostatic capacitance of the capacitor 49 by increasing the electrode area of the lower capacitor electrode 46.

Regarding the three left piezoelectric element rows 65*b* to 65*d*, the capacitors 49 are connected to at least some of the piezoelectric elements 36. However, as for these three piezoelectric element rows 65*b* to 65*d*, the wires corresponding to the piezoelectric element row located closer to the left side have longer total lengths. In view of this, as for the three piezoelectric element rows 65*b* to 65*d*, the capacitors 49 corresponding to the piezoelectric element row more distant from the drive contact portions 40 in terms of the scanning direction have smaller capacitances. For example, in each of the three piezoelectric element rows 65*b* to 65*d*, the capacitors 49 are connected to the piezoelectric elements 36 located at the end portions in the arrangement direction. Here, the electrostatic capacitance of the capacitors 49 (electrode area of the upper capacitor electrodes 47) connected to the piezoelectric elements 36 at the end positions of the leftmost piezoelectric element row 65*d* is the smallest, and the electrostatic capacitance of the capacitors 49 connected to the piezoelectric elements 36 at the end positions of the piezoelectric element row 65*c* is larger than that of the piezoelectric element row 65*d*, and the electrostatic capacitance of the capacitors 49 connected to the piezoelectric elements 36 at the end positions of the piezoelectric element row 65*b* is larger than that of the piezoelectric element row 65*c*.

Further, even in the single piezoelectric element row, as the length of the output wire 56 of the COF 50 is longer, the capacitance of the corresponding capacitor 49 is smaller. That is, the capacitor 49 connected to the piezoelectric element 36 disposed closer to the ends in the arrangement direction, out of the piezoelectric elements 36 in the single piezoelectric element row, has a smaller electrostatic capacitance.

In this embodiment, the lower capacitor electrodes 46 of the capacitors 49 and the upper electrodes 33 of the piezoelectric elements 36 are connected by the conduction parts 48 in the through holes 32*b* of the piezoelectric bodies 32 including the activators 32*a* and the insulators 34. Incidentally, in the through holes 32*b*, the conductive material is not necessarily filled so as to completely fill up space in the through holes 32*b*, and in some cases, the conductive material is only disposed so as to cover inner wall surfaces of the through holes 32*b* and large cavities are formed in the inside thereof. In this case, if the excessive adhesive 45 flows into the cavities when the reservoir forming member 23 is bonded, conduction reliability of the conduction parts 48 in the through holes 32*b* is liable to deteriorate. Regarding this point, in this embodiment, the through holes 32*b* of the piezoelectric bodies 32 are disposed on a more outer side than peripheral regions of the communication holes 42 of the piezoelectric actuator 22, to which the reservoir forming member 23 is bonded, as depicted in FIG. 2 to FIG. 4. Therefore, the excessive adhesive 45 is difficult to flow into the through holes 32*b*.

In the embodiment explained above, the ink-jet head 4 corresponds to a liquid jetting apparatus of the present teaching. The channel forming member 21 and the nozzle plate 20 correspond to a first channel structure of the present teaching. The plurality of nozzles 24 formed in the nozzle plate 20 and the plurality of pressure chambers 26 formed in the channel forming member 21 correspond to a first liquid channel of the present teaching. The reservoir forming member 23 corresponds to a second channel structure of the present teaching. The reservoir 52 and the ink supply channel 53 of the reservoir forming member 23 correspond to a second liquid channel of the present teaching. The lower electrode 31 corresponds to a first element electrode of the present teaching, and the upper electrode 33 corresponds to a second element electrode of the present teaching. The drive contact portion 40 corresponds to a signal input portion of the present teaching. The ground contact portion 41 corresponds to a reference potential portion of the present teaching.

The lower capacitor electrode 46 corresponds to a first capacitor electrode of the present teaching, and the upper capacitor electrode 47 corresponds to a second capacitor electrode of the present teaching. The COF 50 corresponds to a wiring board of the present teaching, and the driver IC 51 corresponds to a driving device of the present teaching. The drive wire 35 connecting the drive contact portion 40 and the piezoelectric element 36 and the conduction path 59 (see, FIG. 7) connecting the lower electrode 31 of the plurality of piezoelectric elements 36 and the ground contact portion 41 correspond to an actuator wire of the present teaching. The output wire 56 of the COF 50 corresponds to a board-side wire of the present teaching. In FIG. 6, the protective layer 39*a* corresponds to a first insulating layer of the present teaching, the protective layer 39*b* corresponds to a second insulating layer of the present teaching, and the protective layer 39c corresponds to a third insulating layer of the present teaching.

Further, especially a correspondence between piezoelectric elements of the present teaching and the structure of this embodiment may be as follows. The piezoelectric element 36 to which the capacitor 49 is connected may correspond to a first piezoelectric element, and the piezoelectric element 36 to which the capacitor 49 is not connected may correspond to a second piezoelectric element. Further, each of the piezoelectric element rows 65b to 65d including the piezoelectric element 36 to which the capacitor 49 is connected may correspond to a first piezoelectric element row, and the piezoelectric element row 65a not including the piezoelectric element 36 to which the capacitor 49 is connected may correspond to a second piezoelectric element row.

Further, a correspondence between piezoelectric elements of the present teaching and the structure of this embodiment may be as follows. Among the piezoelectric elements 36 to which the capacitors 49 are connected, the piezoelectric element 36 whose wire to the driver IC 51 is long may correspond to a first piezoelectric element of the present teaching, and the capacitor 49 connected to this first piezoelectric element may correspond to a first capacitor. On the other hand, the piezoelectric element 36 whose wire has a short length may correspond to a second piezoelectric element of the present teaching, and the capacitor 49 connected to this second piezoelectric element 36 may correspond to a second capacitor. For example, in a case that the plural kinds of capacitors 49 different in capacitance are used in each of the piezoelectric element rows 65b to 65d, the piezoelectric element 36 which is located on the end portion in the arrangement direction and which is connected to the capacitor 49 having a small electrostatic capacitance may correspond to the first piezoelectric element, and the piezoelectric element 36 which is located on the center portion in the arrangement direction and which is connected to the capacitor 49 having a large electrostatic capacitance may correspond to the second piezoelectric element.

Next, modified embodiments in which various modifications are made in the above-described embodiment will be explained. Note that elements having the same structures as those of the above-described embodiment will be denoted by the same reference signs, and a description thereof will be omitted when appropriate.

Figure 8:
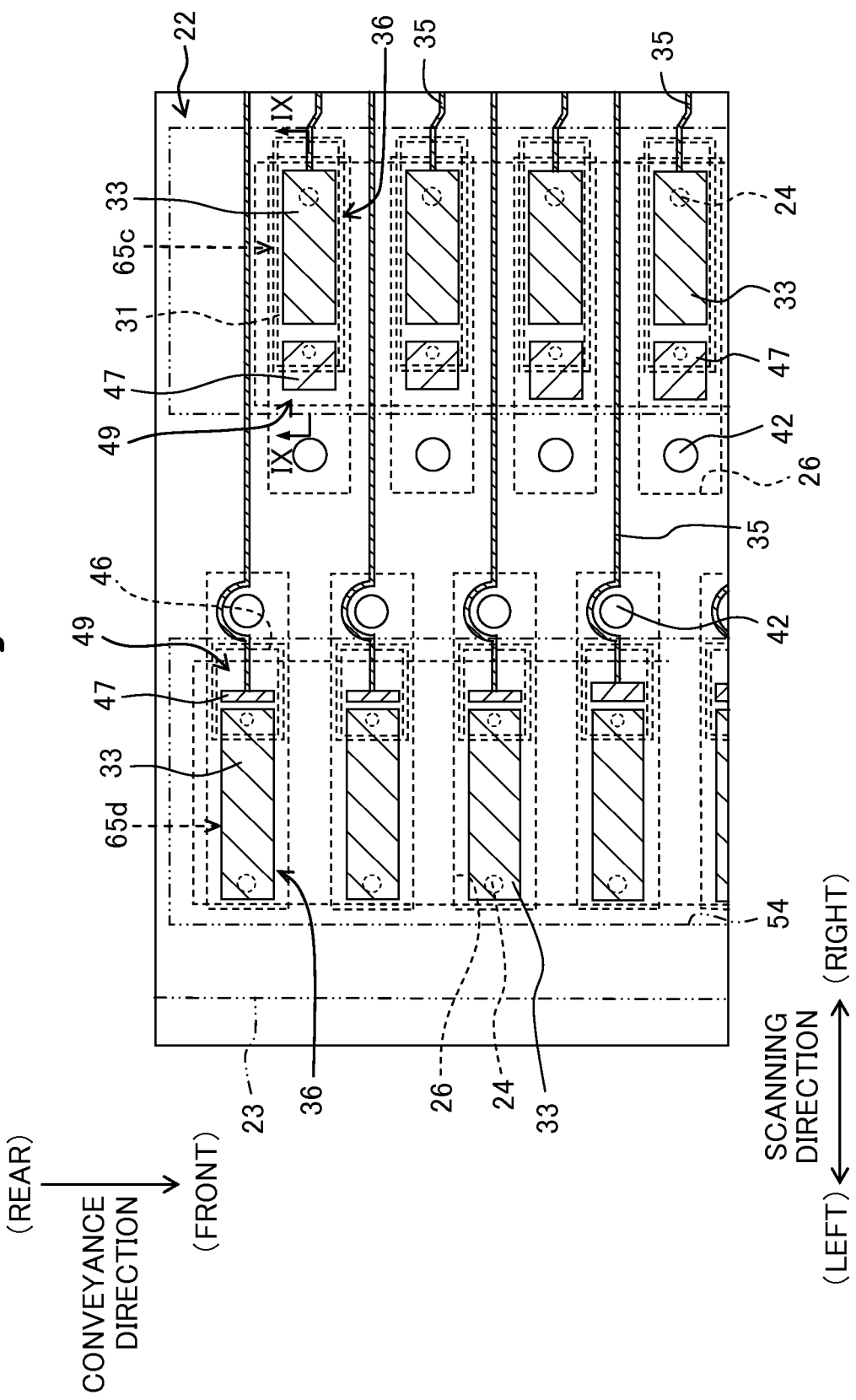
FIG. 8 is an enlarged partial top view corresponding to FIG. 3, of a head unit of a modified embodiment.

1) In the above-described embodiment, the capacitor 49 are provided on the drive wires 35 connecting the drive contact portions 40 and the piezoelectric elements 36. However, the capacitors 49 may be provided on the wires connecting the piezoelectric elements 36 and the ground contact portions 41. In FIG. 8, regarding the left piezoelectric element row 65d, the capacitors 49 are disposed on the right of the piezoelectric elements 36, that is, on the side of the drive wires 35 connecting the piezoelectric elements 36 and the drive contact portions 40, but regarding the right piezoelectric element row 65c, the capacitors 49 are disposed on the left of the piezoelectric elements 36, that is, on a side of the wires connecting the piezoelectric elements 36 and the ground contact portions 41.

Figure 9:
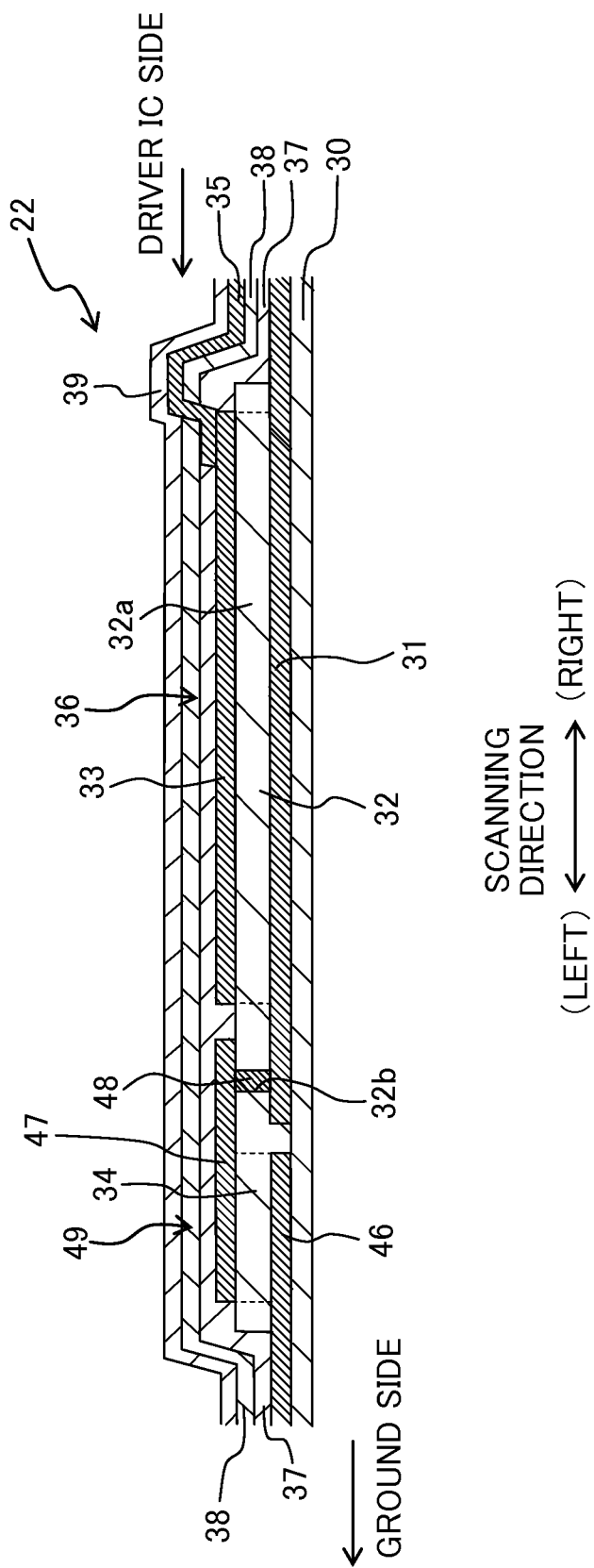
FIG. 9 is a cross-sectional view of a piezoelectric actuator taken along a line IX-IX in FIG. 8.

FIG. 9 is a cross-sectional view taken along a line IX-IX in FIG. 8. As depicted in FIG. 9, in this embodiment, the drive wire 35 connected to the drive contact portion 40 is directly connected to the upper electrode 33 of the piezoelectric element 36. Further, the lower electrode 31 of the piezoelectric element 36 and the upper capacitor electrode 47 of the capacitor 49 is in electric continuity with each other by the conduction part 48 in the through hole 32b. Further, the lower capacitor electrode 46 of the capacitor 49 is connected to the ground contact portion 41. Here, as depicted in FIG. 8, in the left piezoelectric element row 65d, the lower electrodes 31 of the piezoelectric elements 36 are in electric continuity with one another to serve as the common electrode, and are also connected to the ground contact portions 41 to be kept at the ground potential same as in the structure of the above-described embodiment. On the other hand, the lower capacitor electrodes 46 of the capacitors 49 are disposed so as to separate from the surroundings. In contrast, in the right piezoelectric element row 65c, the lower capacitor electrodes 46 of the capacitors 49 are in electric continuity with one another and are connected to the ground contact portions 41. That is, the lower electrodes 31 of the piezoelectric elements 36 are disposed in a separated manner.

Note that, in FIG. 8, in the right piezoelectric element row 65c, the electrode areas of the upper capacitor electrodes 47 of the capacitors 49 are greatly larger as compared with the electrode areas of the upper capacitor electrodes 47 in the left piezoelectric element row 65d. This is because, in the right piezoelectric element row 65c, the upper capacitor electrodes 47 are connected to the lower electrodes 31 of the piezoelectric elements 36 via the conduction parts 48 in the through holes 32b and accordingly project rightward as is seen in FIG. 9. That is, in the capacitors 49 of the right piezoelectric element row 65c, the areas of the upper capacitor electrodes 47 are greatly increased, but regions, of the insulators 34, sandwiched by the upper capacitor electrodes 47 and the lower capacitor electrodes 46 are not greatly increased.

Further, in this modified embodiment, the insulators 34 of all the capacitors 49 are disposed between the peripheral regions of the communication holes 42 of the piezoelectric actuator 22 and the piezoelectric elements 36 as depicted in FIG. 8. Accordingly, since the insulators 34 are disposed so as to surround the peripheral regions of the communication holes 42, it is possible to prevent the excessive adhesive from flowing out toward the piezoelectric elements 36 from the peripheral regions of the communication holes 42 when the reservoir forming member 23 is bonded by the adhesive to the peripheral regions of the communication holes 42 of the piezoelectric actuator 22.

2) As depicted in FIG. 5, in the capacitors 49 of the above-described embodiment, the upper capacitor electrodes 47 are electrodes which are located on the drive wire 35 side and to which a high potential is applied, and the lower capacitor electrodes 46 are electrodes which are located on the ground contact portion 41 side and to which a low potential is applied. However, this relation may be reversed. That is, the low potential may be applied to the upper capacitor electrodes 47 and the high potential may be applied to the lower capacitor electrodes 46.

Figure 10:
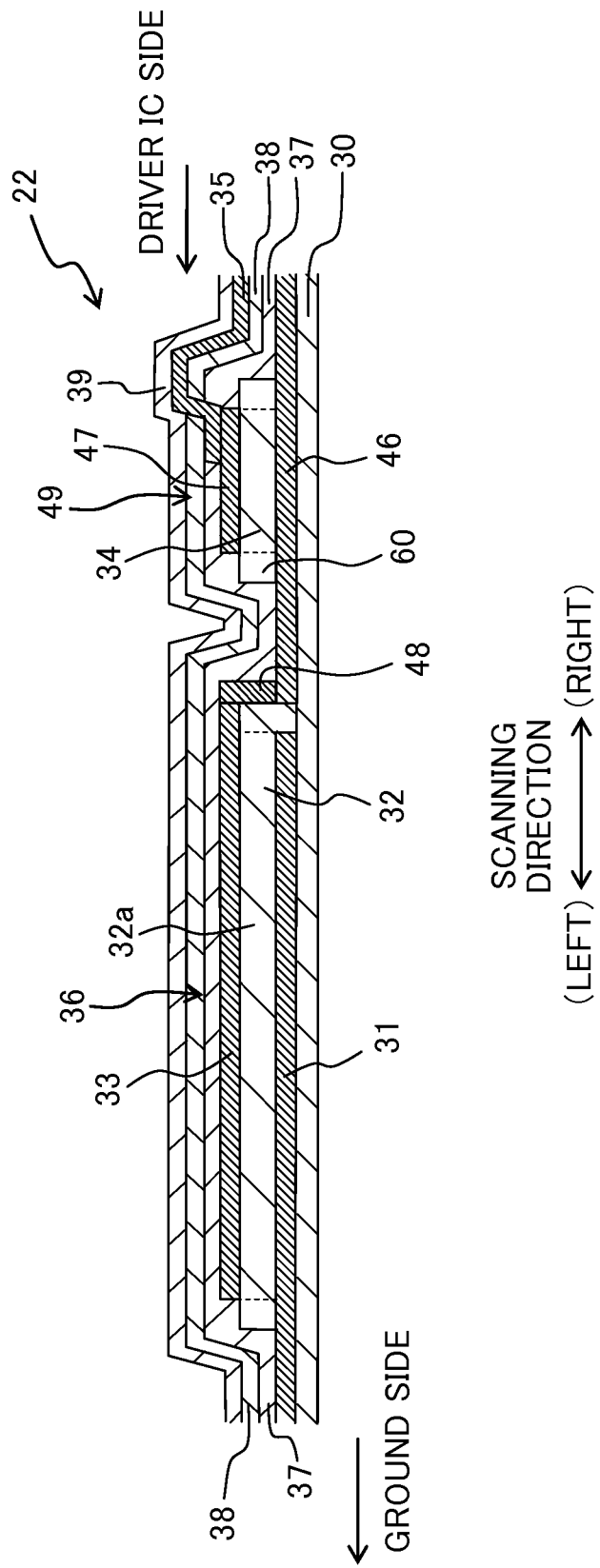
FIG. 10 is a cross-sectional view of a piezoelectric actuator of another modified embodiment.

3) The activators 32a of the piezoelectric elements 36 and the insulators 34 of the capacitors 49 do not necessarily have to be integrated, provided that the activators 32a and the insulators 34 are formed of the same material. For example, as depicted in FIG. 10, the insulator 34 of the capacitor 49 may be disposed apart from the piezoelectric body 32 including the activator 32a of the piezoelectric element 36. Further, in FIG. 10, the conduction part 48 connecting the lower capacitor electrode 46 of the capacitor 49 and the upper electrode 33 of the piezoelectric element 36 is formed on a side surface of the piezoelectric body 32 including the activator 32a. Note that, in the structure depicted in FIG. 10, through hole may be adopted as in the above-described embodiment. In this case, the through hole may be formed in the piezoelectric body 32 including the activator 32a, but the through hole may be formed in portion continuing from the insulator 34, of other piezoelectric body 60 apart from the piezoelectric body 32 and including the insulators 34. Further, the piezoelectric body 32 and the insulator 34 need not be on the same plane. For example, with another layer being stacked on a lower side of either of the piezoelectric body 32 and the insulator 34, height positions of the piezoelectric body 32 and the insulator 34 from the vibration plate 30 may be somewhat different.

Further, in connection with the above description, in the above-described embodiment, the integrated piezoelectric body 32 is formed for the plurality of piezoelectric elements 36 forming the single piezoelectric element row. However, a plurality of piezoelectric bodies 32 separated from each other may be formed for the plurality of piezoelectric elements 36.

Figure 11:
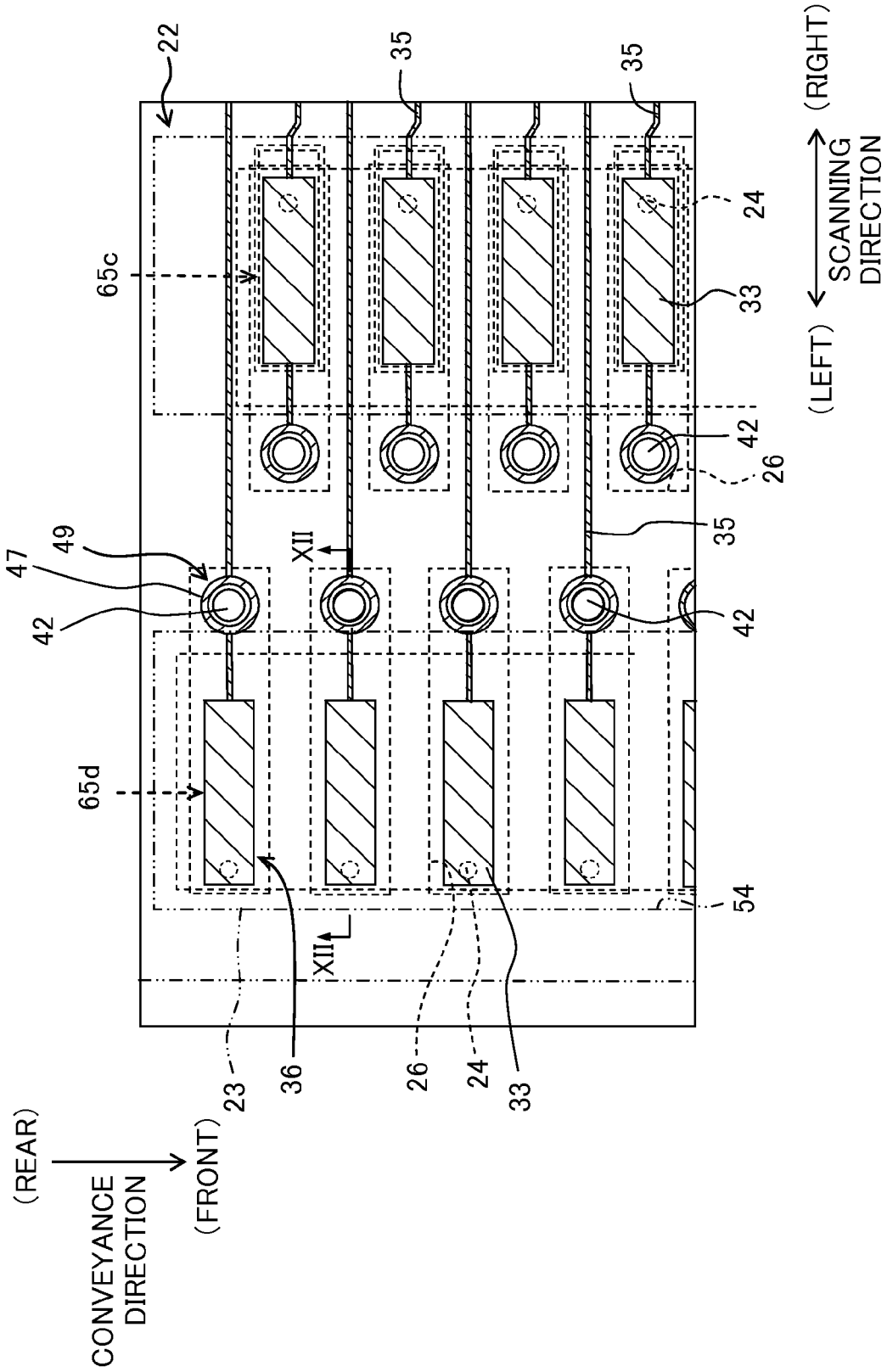
FIG. 11 is an enlarged partial top view corresponding to FIG. 3, of a head unit of still another modified embodiment.
Figure 12:
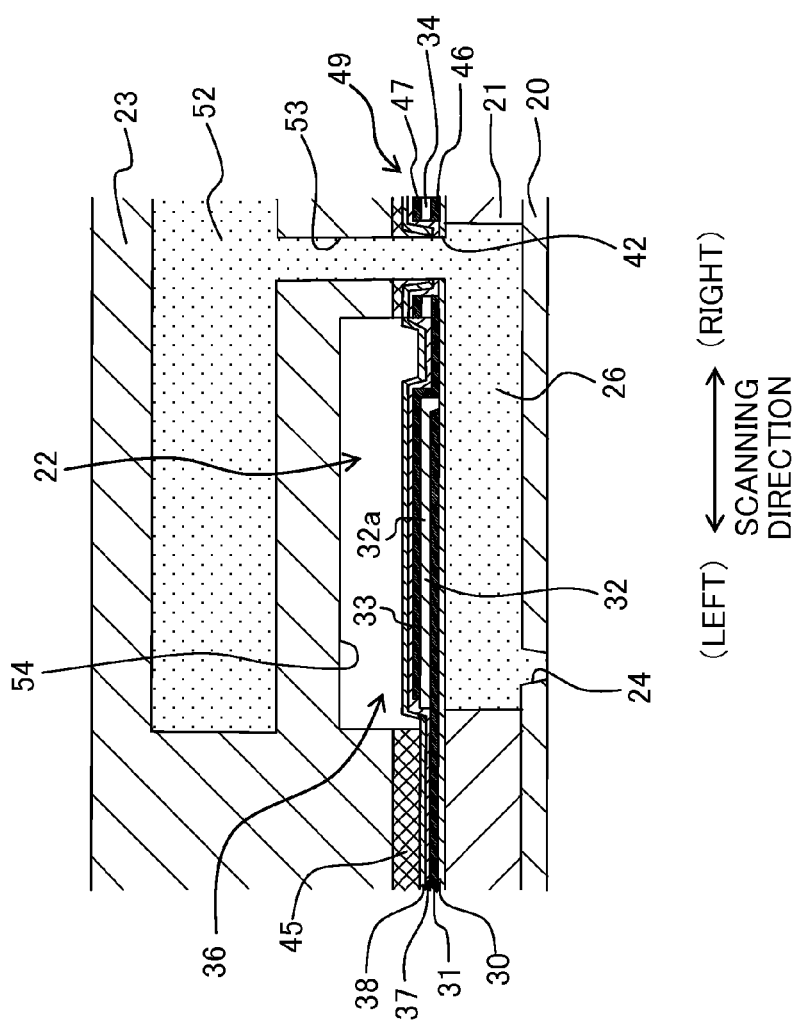
FIG. 12 is a cross-sectional view of the head unit taken along a line XII-XII in FIG. 11.

4) As depicted in FIG. 11 and FIG. 12, the insulators 34 of the capacitors 49 may be disposed on the peripheral regions of the communication holes 42 of the piezoelectric actuator 22. In FIG. 11 and FIG. 12, on the peripheral regions of the communication holes 42 of the piezoelectric actuator 22 (vibration plate 30), the insulators 34, the upper capacitor electrodes 47, and the lower capacitor electrodes 46 of the capacitors 49 are each formed in a ring shape and are disposed so as to surround the communication holes 42 respectively. In this structure, the capacitors 49 including the insulators 34 are disposed so as to surround the communication holes 42, so that ring-shaped wall parts are formed around the communication holes 42 respectively. With this construction, when the reservoir forming member 23 is bonded to the peripheral regions of the communication holes 42 of the piezoelectric actuator 22, it is possible to bond the reservoir forming member 23 to the peripheral regions of the communication holes 42 while pressing the reservoir forming member 23 to the ring-shaped wall parts including the insulators 34, and accordingly sealability of peripheries of the communication holes 42 improves, so that the ink does not easily leak.

Figure 13:
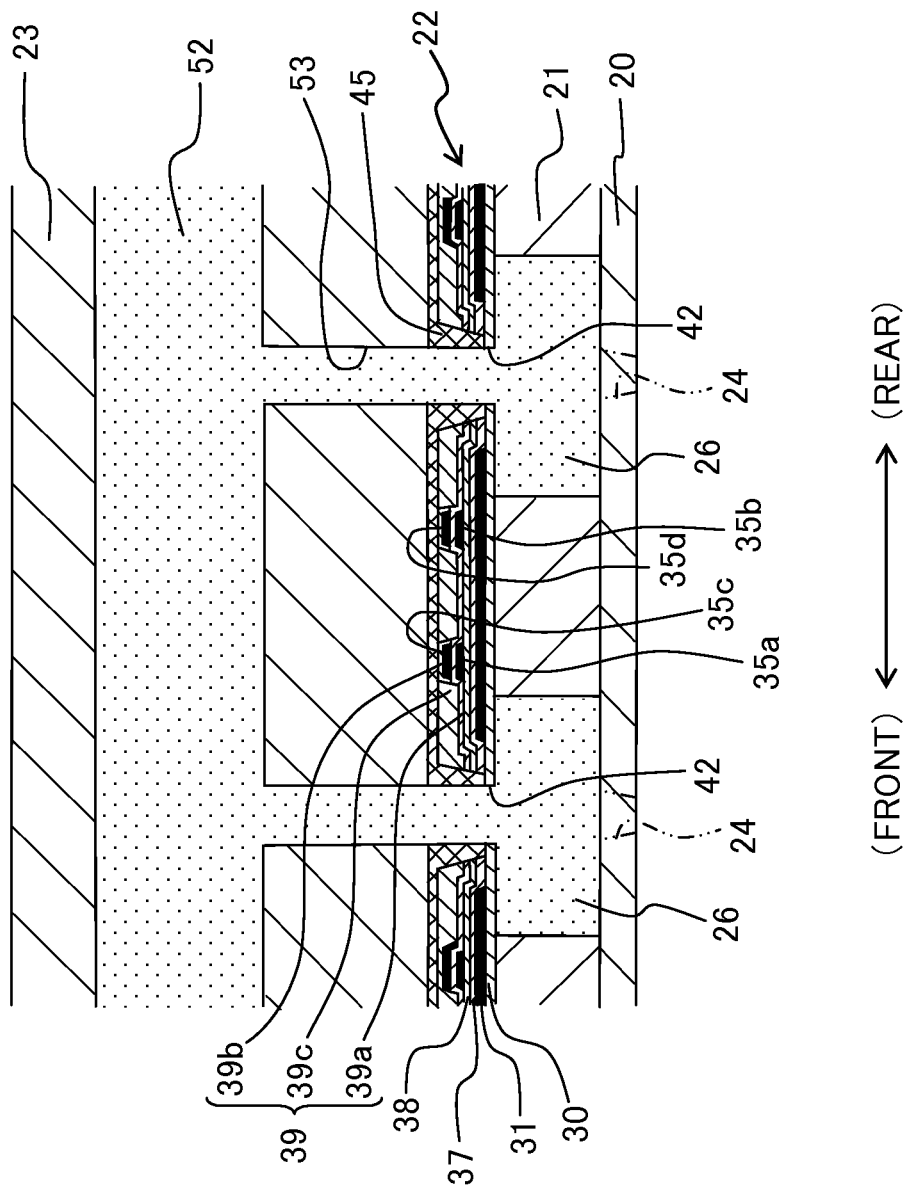
FIG. 13 is a cross-sectional view corresponding to FIG. 6, of a head unit of yet another modified embodiment.

5) The arrangement of the two drive wires 35 or more when the two drive wires 35 or more are passed between the two piezoelectric elements 36 is not limited to the mode depicted in FIG. 6 of the above-described embodiment. FIG. 13 depicts an example where the four drive wires 35 are passed. As depicted in FIG. 13, upper wires 35c, 35d may be disposed so as to completely overlap with wires 35a, 35b disposed on a lower side (vibration plate 30 side), respectively. Note that, in the embodiment in FIG. 13, a dent occurs in a region which is between the two wires 35a, 35b arranged in left-right direction and where no wire 35 is disposed. Therefore, it is preferable to make the entire upper surface flush by forming a protective layer 39c so as to cover this dent.

6) In the above-described embodiment, among the plurality of capacitors 49 provided for some of the piezoelectric elements 36, the electrostatic capacitances of the capacitors 49 are made different, depending on the total lengths of the wires between the piezoelectric elements 36 and the driver IC 51. However, all the capacitors 49 may be equal in the electrostatic capacitance. Alternatively, it is also possible to adopt an embodiment in which the capacitors 49 are provided for all the piezoelectric elements 36 of the piezoelectric actuator 22 and the capacitors 49 are made different in the electrostatic capacitance, depending on the lengths of the wires.

7) In the above-described embodiment, the driver IC 51 is connected to the drive contact portions 40 of the piezoelectric actuator 22 via the COF 50. However, the driver IC 51 may be provided in the piezoelectric actuator 22, and the driver IC 51 may be directly connected to the drive contact portions 40.

8) In the above-described embodiment, the channel forming member 21 is formed of the silicon substrate, and the piezoelectric actuator 22 is formed on the silicon substrate by the well-known semiconductor process technique. However, the channel forming member 21 may be formed of a material other than silicon, for example, a metal material or the like. In a case that the channel forming member 21 is formed of a material other than silicon, the piezoelectric actuator fabricated in a separate process is bonded to the upper surface of the channel forming member 21 by an adhesive. Further, a manufacturing method of the piezoelectric actuator in this case is not particularly limited. For example, the piezoelectric actuator may be manufactured by forming electrodes on a surface of unbaked green sheet by printing or the like and thereafter baking this green sheet.

9) In the above-described embodiment, the lower electrodes 31 located on the vibration plate 30 side of the piezoelectric layer 32 are electrodes on the ground contact portion 41 side, and the upper electrodes 33 located opposite the vibration plate 30 across the piezoelectric layer 32 are electrodes on the drive contact portion 40 side. However, this relation may be reversed.

In the embodiment and the modified embodiments explained hitherto, the present teaching is applied to the inkjet head which jets the ink to the recording sheet to print an image and so on. However, the present teaching is also applicable to a liquid jetting apparatus used in various applications other than the printing of an image and so on. For example, the present teaching is applicable also to a liquid jetting apparatus which jets a conductive liquid to a substrate to form a conductive pattern on the surface of the substrate.

What is claimed is:

1. A liquid jetting apparatus comprising:
a first channel structure in which a first liquid channel is formed, the first liquid channel including a plurality of nozzles and a plurality of pressure chambers communicating with the plurality of nozzles respectively;
a piezoelectric actuator provided on the first channel structure to cover the plurality of pressure chambers; and
a driving device configured to drive the piezoelectric actuator, wherein:
the piezoelectric actuator comprising:
a vibration plate configured to cover the plurality of pressure chambers;
a plurality of piezoelectric elements which are disposed on the vibration plate to correspond to the plurality of pressure chambers respectively, each of the plurality of piezoelectric elements including an activator formed of a piezoelectric material;
a plurality of signal input portions which is provided on the vibration plate and which is connected to the driving device to receive drive signals for driving the plurality of piezoelectric elements from the driving device;
a reference potential portion to which a reference potential is applied; and
a plurality of actuator wires each of which connects one of the plurality of piezoelectric elements and one of the plurality of signal input portions and the reference potential portion;
the plurality of piezoelectric elements include a first piezoelectric element and a second piezoelectric element;
a total length of a wire which connects the first piezoelectric element and the driving device and which includes the actuator wire is longer than a total length of a wire which connects the second piezoelectric element and the driving device and which includes the actuator wire,
the piezoelectric actuator further comprising a capacitor that is connected to the actuator wire which connects the first piezoelectric element and the signal input portion or the actuator wire which connects the first piezoelectric element and the reference potential portion such that the capacitor is serially connected to the first piezoelectric element; and the capacitor includes an insulator formed of a piezoelectric material same as the piezoelectric material of the activators of the plurality of piezoelectric elements.

2. The liquid jetting apparatus according to claim 1, further comprising, a second channel structure in which a second liquid channel communicating with the first liquid channel is formed, wherein:

the second channel structure is disposed on a side opposite to a side on which the first channel structure is disposed with respect to the piezoelectric actuator and is bonded to the piezoelectric actuator;

the piezoelectric actuator includes a communication hole through which the first liquid channel of the first channel structure and the second liquid channel of the second channel structure communicate with each other;

the insulator is disposed on a peripheral region of the communication hole of the piezoelectric actuator to surround the communication hole; and the second channel structure is bonded to the piezoelectric actuator in the peripheral region on which the insulator is provided.

3. The liquid jetting apparatus according to claim 1, further comprising, a second channel structure in which a second liquid channel communicating with the first liquid channel is formed, wherein:

the second channel structure is disposed on a side opposite to a side on which the first channel structure is disposed with respect to the piezoelectric actuator and is bonded to the piezoelectric actuator;

in the vibration plate, a communication hole through which the first liquid channel of the first channel structure and the second liquid channel of the second channel structure communicate with each other is formed;

the second channel structure is bonded to a peripheral region of the communication hole of the piezoelectric actuator by an adhesive; and the insulator is disposed between the peripheral region, of the the piezoelectric actuator, to which the second channel structure is bonded and the first piezoelectric element.

4. The liquid jetting apparatus according to claim 1, further comprising, a second channel structure in which a second liquid channel communicating with the first liquid channel is formed, wherein:

the second channel structure is disposed on a side opposite to a side on which the first channel structure is disposed with respect to the piezoelectric actuator and is bonded to the piezoelectric actuator;

the piezoelectric actuator includes a communication hole through which the first liquid channel of the first channel structure and the second liquid channel of the second channel structure communicate with each other;

each of the plurality of piezoelectric elements includes a first element electrode disposed on the vibration plate side of the activator and a second element electrode disposed on a side opposite to the vibration plate side with respect to the activator, the capacitor includes a first capacitor electrode disposed on the vibration plate side of the activator and a second capacitor electrode disposed on a side opposite to the vibration plate side with respect to the activator, the first element electrode and the second capacitor electrode, or the second element electrode and the first capacitor electrode are connected by a conduction part including a conductive material disposed in a through hole formed in a piezoelectric body including the activator and/or the insulator;

the second channel structure is bonded to a peripheral region of the communication hole of the piezoelectric actuator by an adhesive; and the through hole is disposed on a more outer side than the peripheral region of the communication hole to which the second channel structure is bonded.

5. The liquid jetting apparatus according to claim 1, further comprising, a wiring board connected to the plurality of signal input portions, wherein:

the wiring board includes the driving device and a plurality of board-side wires each of which connects the driving device and one of the plurality of signal input portions are provided; and the board-side wire which connects the driving device and the signal input portion connected to the first piezoelectric element is longer than the board-side wire which connects the driving device and the signal input portion connected to the second piezoelectric element.

6. The liquid jetting apparatus according to claim 1, wherein:

the plurality of piezoelectric elements are aligned in a first direction to form a first piezoelectric element row and a second piezoelectric element row which are arranged side by side in a second direction orthogonal to the first direction;

the plurality of signal input portions are disposed on a side opposite to a side on which the first piezoelectric element row is disposed with respect to the second piezoelectric element row in the second direction; and the first piezoelectric element row includes the first piezoelectric element connected to the capacitor.

7. The liquid jetting apparatus according to claim 6, wherein:

the first piezoelectric element row includes a plurality of the first piezoelectric elements to each of which the capacitor is connected; and the capacitor connected to one of the first piezoelectric elements has a smaller electrostatic capacitance as a total length of a wire connecting the one of the first piezoelectric elements and the driving device is longer.

8. The liquid jetting apparatus according to claim 6, wherein:

a plurality of the first piezoelectric element rows are arranged side by side in the second direction; and the capacitor connected to the first piezoelectric element in one of the first piezoelectric element rows has a smaller electrostatic capacitance as a separation distance in the second direction between the one of the first piezoelectric element rows and the signal input portion is larger.

9. The liquid jetting apparatus according to claim 1, wherein:

the plurality of piezoelectric elements are aligned in a first direction to form three piezoelectric element rows arranged side by side in a second direction orthogonal to the first direction;

the plurality of signal input portions are disposed on one side of the three piezoelectric element rows in the second direction;

two actuator wires out of the plurality of actuator wires are arranged between two piezoelectric elements out of the plurality of piezoelectric elements which form the piezoelectric element row disposed closest to the one side among the three piezoelectric element rows, the two actuator wires being connected to the other two piezoelectric element rows among the three piezoelectric element rows respectively; and height positions of the two actuator wires from the vibration plate are different from each other.

10. The liquid jetting apparatus according to claim 9, wherein:

one of the two actuator wires is covered by a first insulating layer;

the other of the two actuator wires is formed on the first insulating layer, in a portion not overlapping with the one actuator wire in plan view, and the other of the two actuator wires has a height position from the vibration plate higher than a height position from the vibration plate of the one actuator wire;

the other actuator wire is covered by a second insulating layer; and a portion, of the first insulating layer, which covers the one actuator wire, is further covered by a third insulating layer.

11. The liquid jetting apparatus according to claim 1, wherein the insulator of the capacitor is formed simultaneously with a forming of the activator of the piezoelectric element in a process of forming the activator.

12. A liquid jetting apparatus comprising:

a first channel structure in which a first liquid channel is formed, the first liquid channel including a plurality of nozzles and a plurality of pressure chambers communicating with the plurality of nozzles respectively;

a piezoelectric actuator provided on the first channel structure to cover the plurality of pressure chambers; and a driving device configured to drive the piezoelectric actuator, wherein:

the piezoelectric actuator comprising:

a vibration plate configured to cover the plurality of pressure chambers;

a plurality of piezoelectric elements which are disposed on the vibration plate to correspond to the plurality of pressure chambers respectively, each of the plurality of piezoelectric elements including an activator formed of a piezoelectric material;

a plurality of signal input portions which are provided on the vibration plate and which are connected to the driving device to receive drive signals for driving the plurality of piezoelectric elements from the driving device;

a reference potential portion to which a reference potential is applied; and a plurality of actuator wires each of which connects one of the plurality of piezoelectric elements and one of the plurality of signal input portions and the reference potential portion;

the plurality of piezoelectric elements include a first piezoelectric element and a second piezoelectric element;

a total length of a wire which connects the first piezoelectric element and the driving device and which includes the actuator wire is longer than a total length of a wire which connects the second piezoelectric element and the driving device and which includes the actuator wire, the piezoelectric actuator further includes:

a first capacitor that is connected to the actuator wire which connects the first piezoelectric element and the signal input portion or the actuator wire which connects the first piezoelectric element and the reference potential portion such that the first capacitor is serially connected to the first piezoelectric element; and a second capacitor that is connected to the actuator wire which connects the second piezoelectric element and the signal input portion or the actuator wire which connects the second piezoelectric element and the reference potential portion such that the second capacitor is serially connected to the second piezoelectric element;

an electrostatic capacitance of the first capacitor is smaller than an electrostatic capacitance of the second capacitor; and the first capacitor and the second capacitor each includes an insulator formed of a piezoelectric material same as the piezoelectric material of the activators of the plurality of piezoelectric elements.

\* \* \* \* \*